US 6,717,807 B2

(12) United States Patent
Hikawa

(10) Patent No.: US 6,717,807 B2
(45) Date of Patent: Apr. 6, 2004

(54) COOLING STRUCTURE FOR ELECTRONIC CIRCUIT UNIT

(75) Inventor: Koji Hikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/272,957

(22) Filed: Oct. 17, 2002

(65) Prior Publication Data

US 2003/0174466 A1 Sep. 18, 2003

(30) Foreign Application Priority Data

Mar. 12, 2002 (JP) ........................... 2002-067514

(51) Int. Cl.[7] ................................................. H05K 7/20
(52) U.S. Cl. ...................... 361/690; 361/688; 361/689; 454/184
(58) Field of Search ................ 361/680–697, 361/721; 174/161, 252; 165/802, 803, 184.33, 122; 454/184

(56) References Cited

U.S. PATENT DOCUMENTS

| 3,874,444 A | * | 4/1975 | Perce et al. ................... 165/47 |
| 4,935,845 A | * | 6/1990 | Schwehr et al. ............. 361/694 |
| 5,528,454 A | * | 6/1996 | Niklos ......................... 361/695 |
| 6,163,454 A | * | 12/2000 | Strickler ...................... 361/695 |
| 6,463,997 B1 | * | 10/2002 | Nicolai et al. ............. 165/80.2 |
| 6,512,672 B1 | * | 1/2003 | Chen ........................... 361/695 |

FOREIGN PATENT DOCUMENTS

| JP | 55-138300 | 10/1980 |
| JP | 56-106495 | 8/1981 |
| JP | 01089599 | 4/1989 |

* cited by examiner

Primary Examiner—Boris Chervinsky
(74) Attorney, Agent, or Firm—Katten Muchin Zavis Rosenman

(57) ABSTRACT

A cooling structure for separating a cooling air which is forced to pass an electronic unit in a horizontal direction. The electronic circuit unit is attached in a subunit of a communication device. The cooling structure includes a separation member for separating an intake air and a discharge air into a front area and a back area. This separation member is provided at an upper side or a lower side of the subunit, and extends from one side to the other side of the subunit.

21 Claims, 21 Drawing Sheets

COOLING STRUCTURE FOR ELECTRONIC CIRCUIT UNIT

BACKGROUND OF THE INVENTION

1. Field of the Invention

The present invention relates to a cooling structure for an electronic circuit unit in which the electronic circuit unit, including, for example, a printed-circuit board, is arranged horizontally, and cooling air for the electronic circuit unit is forced to flow in the horizontal direction. This cooling structure may be applied to various information processing devices, communication devices, and other electronic devices.

2. Description of the Related Art

FIGS. 1A and 1B schematically show a communication device subunit 1 (i.e., a subunit 1 of the communication device) with FIG. 1A being a front view and FIG. 1B being a plan view. In FIG. 1A, first electronic circuit units 2, including printed-circuit boards, are attached to a frame from the front side. The first electronic circuit units 2 are horizontally disposed. Six layers of the first electronic circuit units 2 are individually attached such that these six electronic circuit units 2 are attachable to and detachable from the frame. Two power units 3 are inserted at the right and left sides below the first electronic circuit units 2.

A back board 4, also including a printed-circuit board, is indicated by the dashed line around the center of FIG. 1B, and extends in a vertical direction. This back board 4 has connectors which are connected to back side connectors (not shown) of the first electronic circuit units 2 by plug connections. The back board 4 is connected to the power units 3 by plug connections.

A plurality of second electronic circuit units 5 similar to the first electronic units 2 are attachably and detachably mounted at the back side opposite the front side. The second electronic circuit units 5 are horizontally disposed. These second electronic circuit units 5 are connected to the back board 4 by plug connectors.

At the left side of FIG. 1B, a first fan unit 6 is inserted toward one side of the back board 4 from the front side of the subunit 1, and a second fan unit 7 is inserted toward the other side of the back board 4 from the back side of the subunit 1. The first and second fan units 6 and 7 are also connected to the back board 4 by plug connectors. At the right side of FIG. 1B, a wide air filter 8 is inserted from the front side of the subunit 1, and extends substantially over a range where the first electronic circuit units 2 and the second electronic circuit units 5 are positioned.

Panel boards are provided to cover exposed sides of the first electronic circuit units 2, the second electronic circuit units 5, the power units 3, the first fan unit 6, the second fan unit 7, and the air filter 8. The panel boards are fixed to the frame by means of attaching screws. In this manner, the front side and back side of the communication device subunit 1 are closed by the respective panel boards without an opening to the outside.

Fitting metals 9 which are L-shaped in FIG. 1B are attached at the right and left sides of the front side, as shown in FIG. 1A. The communication device subunit 1 is attached to a rack (which will be described later) by attaching holes 11 of the attaching metals 9. FIG. 2 is a side view showing the left side of FIGS. 1A and 1B. The first fan unit 6 has nine fans 12, and the second fan unit 7 has six fans 13.

Although an upper surface and both side surfaces are covered by a cover 14, many air holes for air passage are provided on the both side surfaces over a wide range. Electric circuits and signal circuits are connected between the respective internal units via the back board 4. The internal units may be connected to electric circuits and signal circuits used for connection with external devices or the like by using connectors (not shown). Electronic components which operate at a high speed are disposed in high density on the first electronic circuit units 2 and the second electronic circuit units 5. Accordingly, when the first and second electronic circuit units 2 and 5 operate, considerable heat is generated. For this reason, the first fan unit 6 and the second fan unit 7 are actuated in order to discharge the heated air to the outside of the left side of the communication device subunit 1 in FIG. 1B via the air holes formed on the cover 14. Cool air of the outside is introduced from the right side of FIG. 1B via air holes formed on the cover 14 and the air filter 8.

The introduced air passes by the arranged circuit boards of the first and second electronic circuit units 2 and 5, absorbs the heat generated from the electronic components, and is discharged to the outside by the first and second fan units 6 and 7. Thus, the electronic components are cooled. The power units 3 are cooled by the first fan unit 6 in the same manner.

FIG. 3 is a cross sectional view of the rack which accommodates the communication device subunits 1. In FIG. 3, the lower side is the front side of the rack, and the upper side is the back side of the rack. As a basic structure, this rack 21 includes a pair of longitudinal frames 22 and a pair of longitudinal frames 23, a ceiling member 24, and a bottom sheet member shown in FIG. 4. The pair of the longitudinal frames 22 are provided at the front side of the rack 21, and the pair of the longitudinal frames 23 are provided at the back side of the rack 21. The longitudinal frames 22 and 23 are made of sheet metal, and are formed by folding the sheet metal. The ceiling member 24 and the bottom sheet member 25 are coupled to the longitudinal frames 22 and 23 at the upper side and the bottom side, respectively.

In FIG. 3, reinforcing members for coupling the longitudinal frames 22 and 23 with each other, various members of the bottom sheet member 25, and attaching screws are omitted for the sake of the simple illustration. These members are also omitted in other drawings. In the rack 21, side covers 26 on both sides, and a back side boor 27 on the back side which can be opened and closed are provided, but are not necessary in some cases. When the side covers 26 and the back side door 27 are provided, appropriate air holes are formed in them for the reason which will be described later.

Pairs of guide supporting members 28 or rails are attached at front end surfaces and back end surfaces of the longitudinal frames 22 and 23 inside the rack 21. The rails 28 are attached at predetermined intervals in a vertical disposition such that a pair of rails 28 are symmetrical with respect to the right and left sides. The rails 28 are used for guiding the communication device subunit 1 when the communication sub unit 1 is inserted into the rack 21. FIG. 4 is a front view of the rack 21 into which the communication device subunits 1 have been inserted. The communication device subunit 1 is placed on the rails 28, and inserted into the rack 21. The communication device subunit 1 is then fixed to the front surfaces of the longitudinal frames 22 at the front side of the rack 21, by applying screws to attaching holes 11 of the attaching metals 9. The state in which the communication device subunits 1 have been attached in this manner is shown in FIG. 4.

Appropriate spaces are provided between the communication device subunits 1. Furthermore, an appropriate space is provided at the upper side of the top most communication device subunit 1, and an appropriate space is also provided at the lower side of the bottom most communication device subunit 1. In order to close these spaces, panel boards 29 whose vertical width are narrow are attached to the rack 21 by means of screws, as shown in FIG. 4. In addition, a strong base frame 31 is provided at the bottom of the rack 21 for supporting the entire rack 21, and firmly stabilizing (or fixing by means of screws) the rack 21 on a floor or the like. FIG. 5 is a cross sectional view of the rack 21 shown in FIG. 4, and shows an upper surface of one of the communication subunits 1.

FIG. 6 is a cross sectional view of the rack 21 which is the same as that of FIG. 5, but shows cooling air flow, indicated by arrows, to the communication device subunit 1 shown in FIGS. 1A and 1B together with the rack 21. As apparent from FIG. 6, the communication device subunit 1 is set such that the back part of the communication subunit 1 does not overlap the longitudinal frames 23 at the back side of the rack 21. This is so that electric wiring cables are not located where discharge air, generated by the first fan unit 6 and the second fan unit 7, flows in order not to block the discharge and/or intake air which flows between both sides of the rack 21 in a horizontal and/or vertical direction. The same arrangement is applied to the air intake side so that the electric wiring cables or the like may not obstruct the air filter 8. Accordingly, there is no obstacle in that air is taken in from the outside at one side of the rack 21, and the air is discharged to the outside at the other side of the rack 21, as indicated by the arrows.

When necessary, for example, for a large volume of a communication amount, the rack 12 can accommodate a plurality of communication device subunits 1, and a plurality of racks, each of which includes these communication device subunits 1, are arranged in a row and/or in a parallel manner. As described above by referring to FIG. 6, the rack 21 takes in air for cooling from one side, and discharges the heated air from the other side. Accordingly, where a plurality of racks 21 are arranged in a row, it is required that an appropriate space should be provided between the racks 21, as shown in FIG. 7.

A sufficient distance between the racks 21 is needed so that the discharged heated air may be sufficiently dispersed, and the temperature of the air that the adjacent rack 21 takes in is low enough so as not to have an adverse effect on cooling of the adjacent communication device subunit 1. If an appropriate space between the racks 21 is not to be provided, an appropriate wall such as a partition board should be provided between the racks 21. However, this creates a problem that the discharged air flows into the air intake side via another air path.

When the racks 21 are arranged such that the racks 21 are close to each other as shown in FIG. 8, a side cover 32 which has no air holes and prevents interference with the air of the outside is provided. However, in the case of this structure, the discharge air mixes with the intake air by circulating in the spaces at the back side of the communication device subunits 1 and the spaces between the communication device subunits 1. The resulting temperature of the inside is raised, so this structure cannot be implemented.

SUMMARY OF THE INVENTION

With the view of the above-mentioned structure, it is an object of the present invention to provide a cooling structure for an electronic circuit unit in which the above-mentioned problems do not occur, cooling air for the electronic circuit unit which is forced to flow in a horizontal direction is effectively separated such that discharge air is not mixed with intake air.

According to a first aspect of the present invention, there is provided a cooling structure for an electronic circuit unit in which cooling air passes the electronic circuit unit of the subunit in a horizontal direction. Specifically, this cooling structure includes separation members provided at the upper side and/or the lower side of the subunit for separating cooling intake air and discharge air into a front area and a back area. These separation members extend from one side to the other side of the subunit.

With this cooling structure, the cooling air is introduced from one side of the subunit and discharged from the other side of the subunit in order to cool the electronic circuit unit of the subunit. The intake air introduced from one side of the subunit is separated from the discharge air discharged from the other side of the rack by the separation member provided at the upper side and/or the lower side of the subunit. The discharge air is guided toward the discharge side by the separation member. In this manner, the intake air is not mixed with the discharge air.

According to a second aspect of the present invention, there is provided a cooling structure for a horizontally disposed electronic circuit unit in which cooling air passes the electronic circuit unit of the subunit in a horizontal direction. Specifically, this cooling structure includes separation members provided at the upper side and/or the lower side of the subunit for separating cooling intake air and discharge air into a front area and a back area. These separation members extend from one side to the other side of the subunit.

With this cooling structure, the cooling air is introduced from one side of the subunit and discharged from the other side of the subunit to cool the horizontally disposed electronic circuit unit. The intake air introduced from one side of the subunit is separated from the discharge air discharged from the other side of the rack by the separation member provided at the upper side and/or the lower side of the subunit. The discharge air is guided toward the discharge side by the separation member. In this manner, the intake air is not mixed with the discharge air.

According to a third aspect of the present invention, there is provided a cooling structure for an electronic circuit unit in which cooling air is forced to pass by the electronic circuit unit in a horizontal direction. Specifically, this cooling structure includes separation members provided at an upper side and/or a lower side of the subunit for separating intake air and discharge air of the cooling air into a front area and a back area. The separation member extends from one side to the other side of the subunit. Particularly, this cooling structure further includes a shielding member provided on the separation member and extending toward the side surface of the rack which accommodates the subunit. The shielding member shuts off upward and downward air flow of the cooling air.

With this cooling structure, the cooling air is introduced from one side of the subunit and discharged from the other side of the subunit to cool the electronic circuit unit of the subunit. The intake air introduced from one side of the subunit is separated from the discharge air discharged from the other side of the rack by the separation member provided at the upper side and/or the lower side of the subunit. The discharge air is guided toward the discharge side by the separation member. In this manner, the intake air is not mixed with the discharge air. The discharge air is also prevented from flowing toward the air intake side via the spaces of the upper side and the lower side of the subunit, by the shutting effect of the shielding member.

According to a fourth aspect of the present invention, the electronic circuit unit in the cooling structure of any one of the first, second, and third aspects of the present invention includes a printed-circuit board. According to a fifth aspect of the present invention, the cooling air in the cooling structure of the electronic circuit unit in any one of the first, second, and third aspects of the present invention is caused to pass by the electronic circuit unit by a fan which is provided at a side surface of the electronic circuit unit and which is operated by electric power.

According to a sixth aspect of the present invention, the separation member includes an upper surface sheet, a lower surface sheet, and a hypotenuse portion which is provided between the upper surface sheet and the lower surface sheet and extends from one side at a front side to the other side at a back side so as to shut off air flow between the front area and the back area.

According to a seventh aspect of the present invention, the separation member includes an upper surface sheet, a lower surface sheet, and a shielding sheet which is provided between the upper surface sheet and the lower surface sheet, extends from one side at a front side to the other side at a back side, has at least three bent points so at to separate the intake air and discharge air into the front area and the back area, and shut off air flow between the front area and the back area, with the front area being a right area and the back area being a left area.

According to an eighth aspect of the present invention, the cooling structure further includes a shielding member for shutting off upward and/or downward flow of the cooling air, wherein the shielding member extends toward a side surface of a rack which accommodates the subunit, and the shielding member is disposed on a rail which is provided in the rack and on which the subunit is inserted and which supports the subunit.

According to a ninth aspect of the present invention, the shielding member is integrally formed on an upper surface sheet or a lower surface sheet of the separation member.

Other objects, features, and advantages of the present invention will become more apparent from the following detailed description when read in conjunction with the accompanying drawings.

DETAILED DESCRIPTION OF THE INVENTION

Figure 1A:
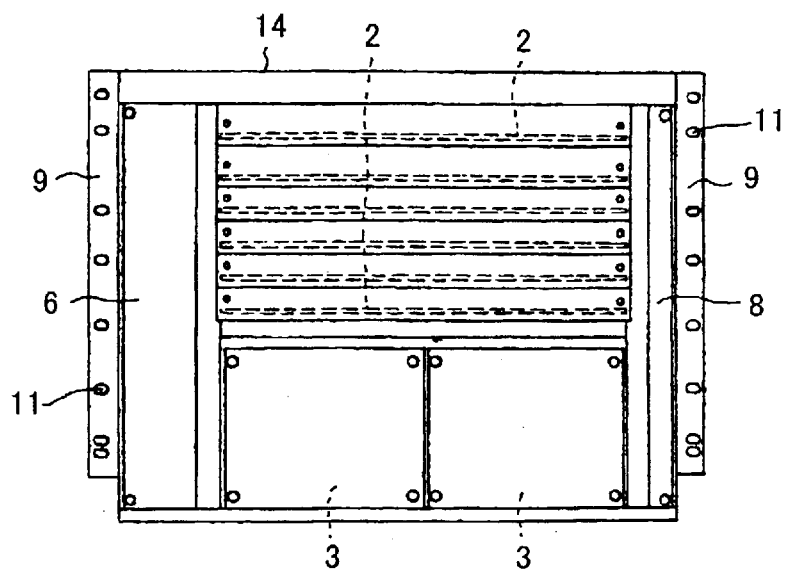
FIG. 1A is a front view showing schematic appearance of a communication device subunit related to the present invention.

In the following, a preferred embodiment of a structure for cooling an electronic circuit unit according to the present invention will be described in detail with reference to the drawings. For better understanding of the same elements, the same reference numerals are used to designate the same elements in all the drawings.

Figure 9:
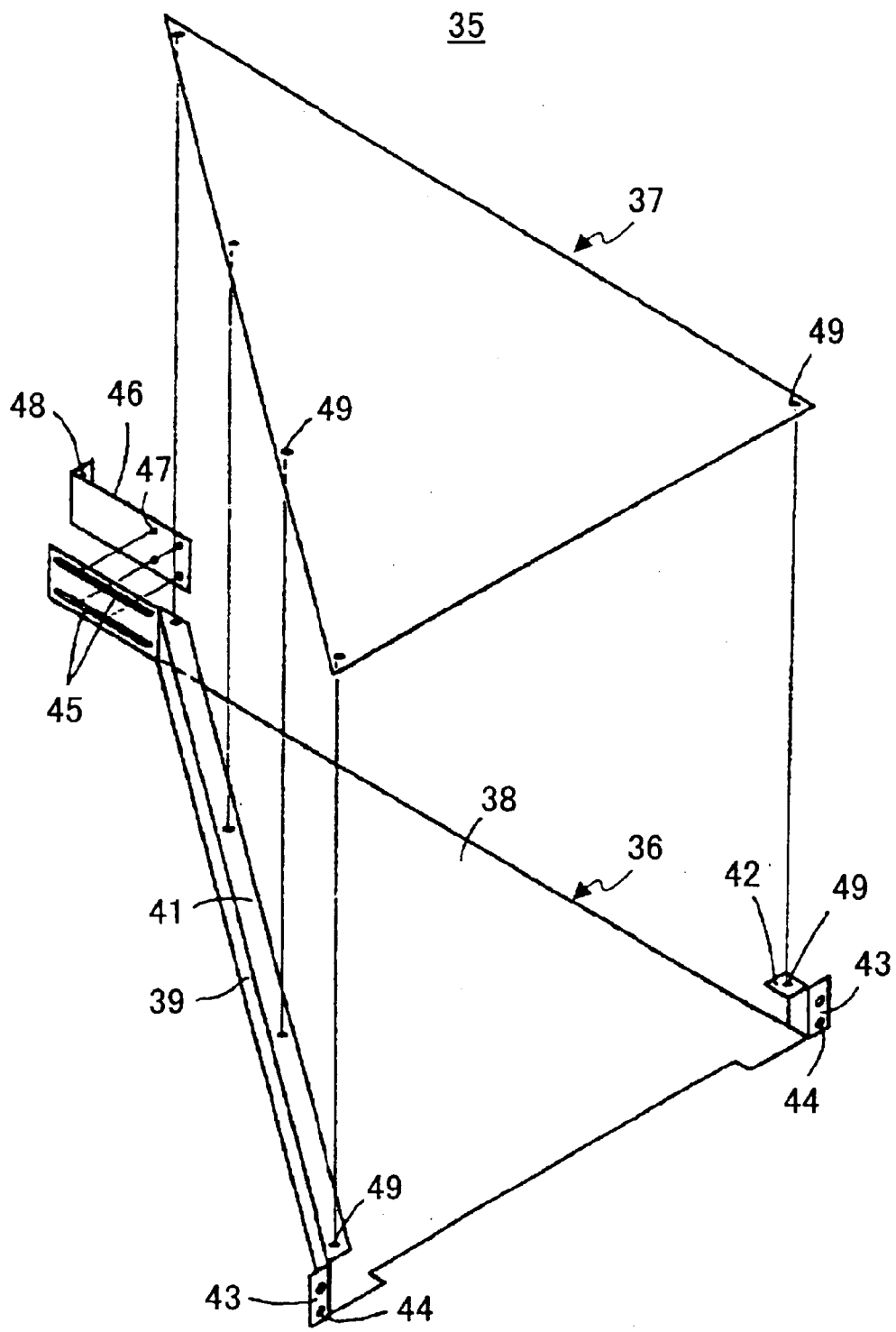
FIG. 9 is a perspective view of a first embodiment of a separation member according to the present invention.

FIG. 9 is a perspective view of a first embodiment of a separation member according to the present invention, and shows a state where the separation member 35 is separated. The separation member 35 includes sheet metal members. For example, the separation member 35 includes a body part 36 in the below side of FIG. 9 and a flat cover sheet 37 in the above side. The body part 36 can be made of a stainless steel sheet. A bottom surface sheet 38 of the body part 36 has a shape of a right triangle. A hypotenuse portion 39 of the right triangle is bent or folded so as to stand upright at a right angle relative to the bottom surface sheet 38. The hypotenuse portion 39 is bent at another part so as to form a band portion 41 which is in parallel with the bottom surface sheet 38.

An attaching surface 42 whose one side is bent to be hook-shaped is formed at a right-angled portion on the bottom surface sheet 38 which faces the hypotenuse portion 39. An attaching surface 43 is formed at the hypotenuse portion 39 which faces a position of the attaching surface 42. A pair of attaching surfaces 43, i.e., the attaching surface 43 of the hypotenuse 39 and an attaching surface 43 at the attaching surface 42, extend in two directions as shown in FIG. 9. Attaching holes 44 are formed on each of the attaching surfaces 43. An opposite side of the hypotenuse portion 39 from the attaching surface 43 extends along a base of the triangle. Two slender holes 45 are formed on this opposite side. Screw holes 47 are formed on an L-shaped fitting metal 46 in order to enable the fitting metal 46 to be attached to the slender holes 45 by means of screws. Furthermore, attaching holes 48 are formed on the other surface of the L-shaped fitting metal 46.

The band portion 41 and the attaching surface 42 of the body part, and a hypotenuse portion and a right-angled portion of the cover sheet 37 each have attaching holes 49. The body part 36 and the cover sheet 37 are adhered and combined to each other by applying known blind rivets to these attaching holes 49. The body part 36 and the cover sheet 37 are fixed to each other in a caulking manner. This separation member 35 has openings at a right side and a front side of FIG. 10, and the hypotenuse side 39 is closed. Thus, the separation member 35 has a shape of a so-called duct.

Figure 1B:
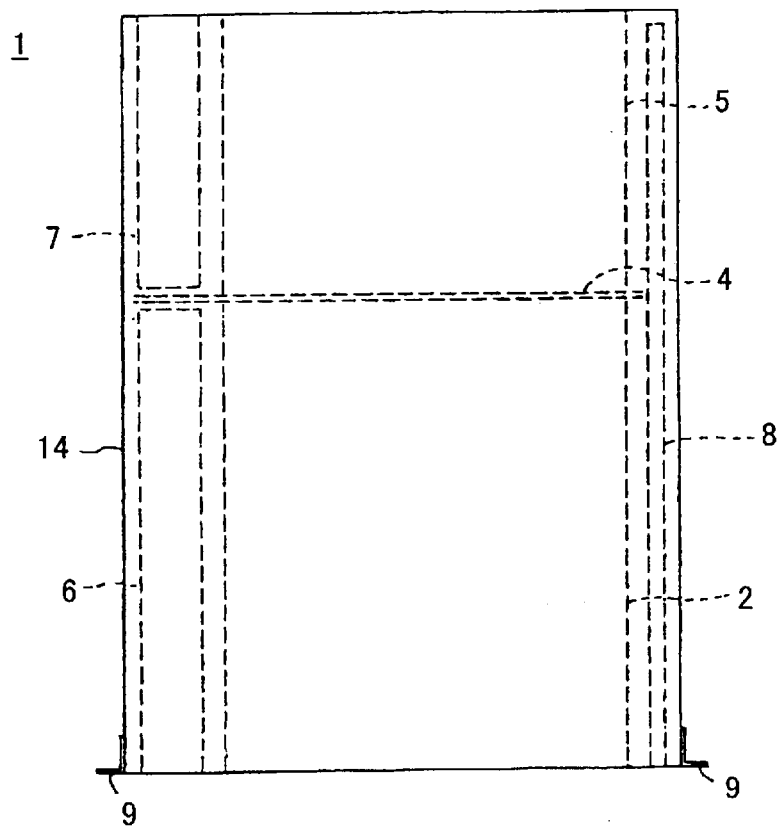
FIG. 1B is a plan view showing schematic appearance of a communication device subunit to which the present invention is applied.
Figure 2:
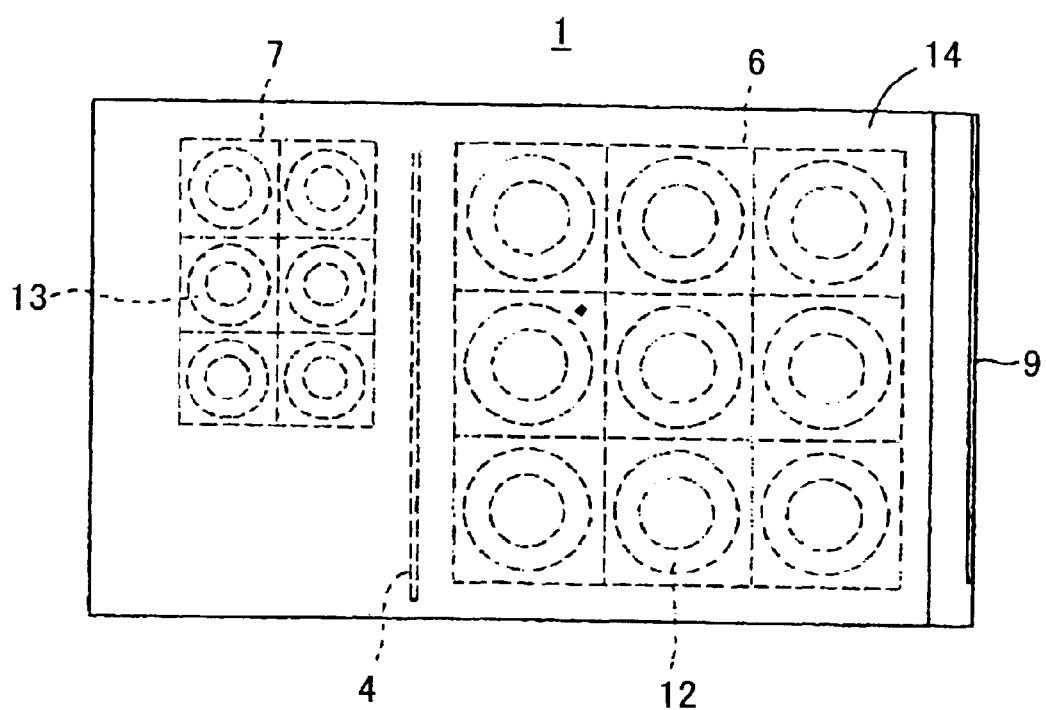
FIG. 2 is a side view of the communication device subunit of FIGS. 1A and 1B.
Figure 3:
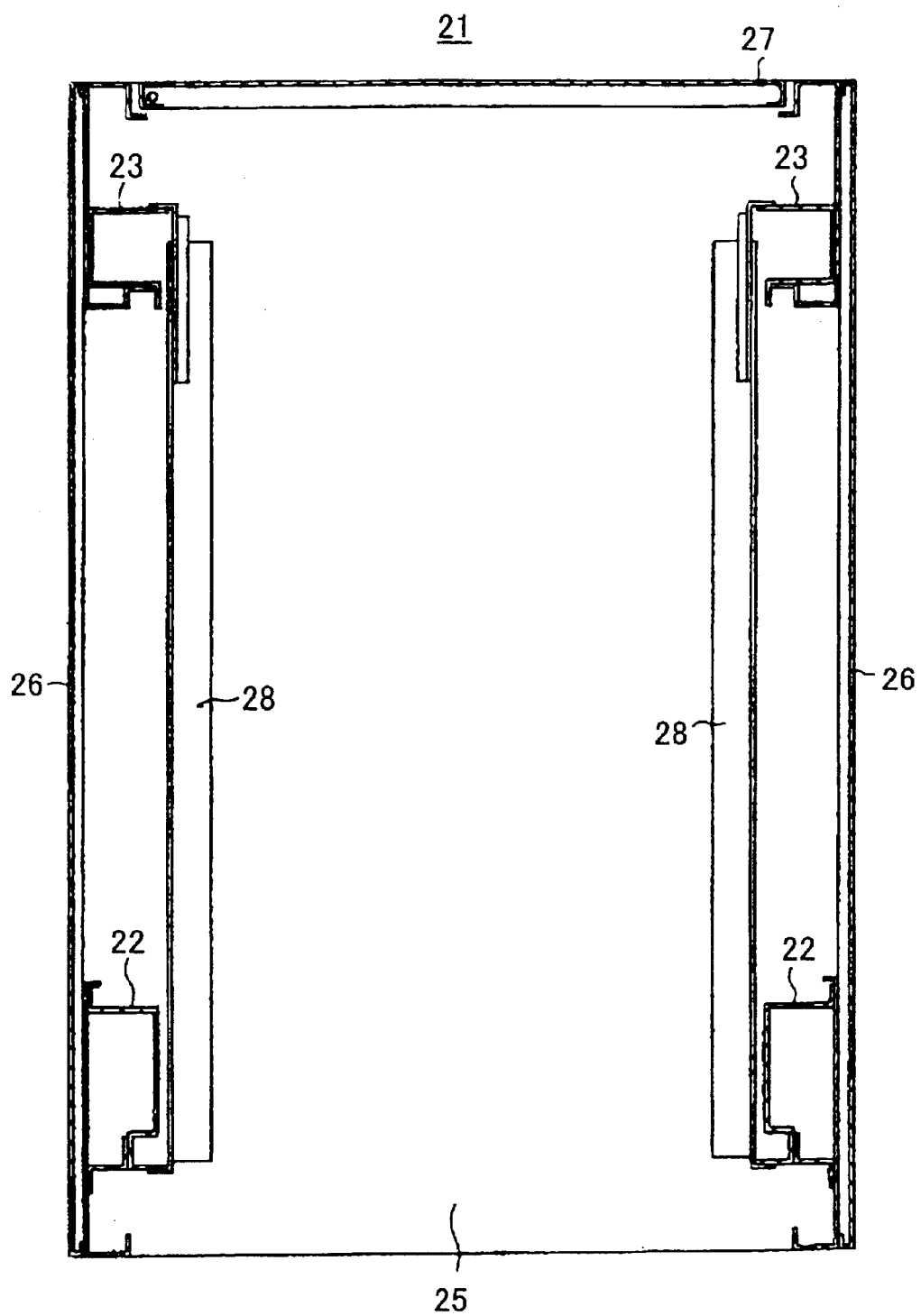
FIG. 3 is a schematic cross sectional view of the rack used in the present invention.
Figure 4:
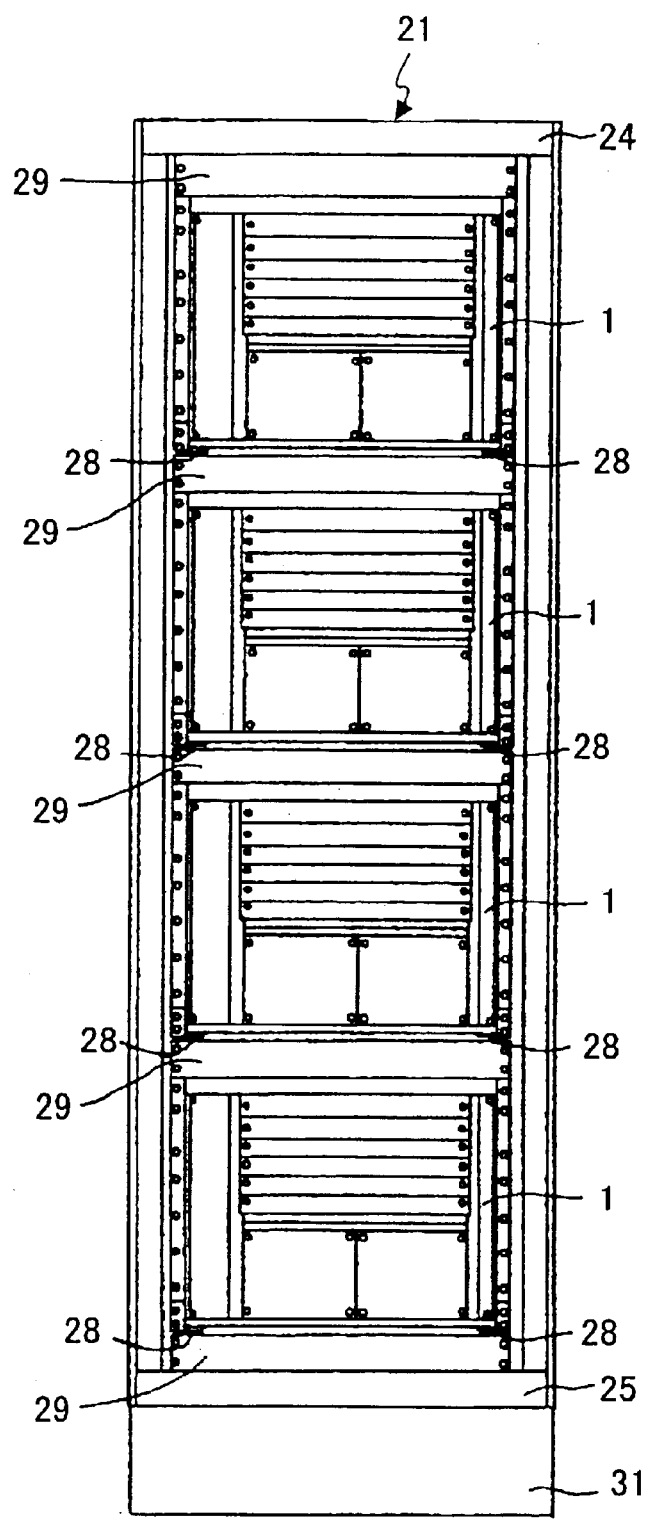
FIG. 4 is a front view of the rack of the FIG. 3 to which the communication device subunits of FIGS. 1A and 1B are attached.
Figure 5:
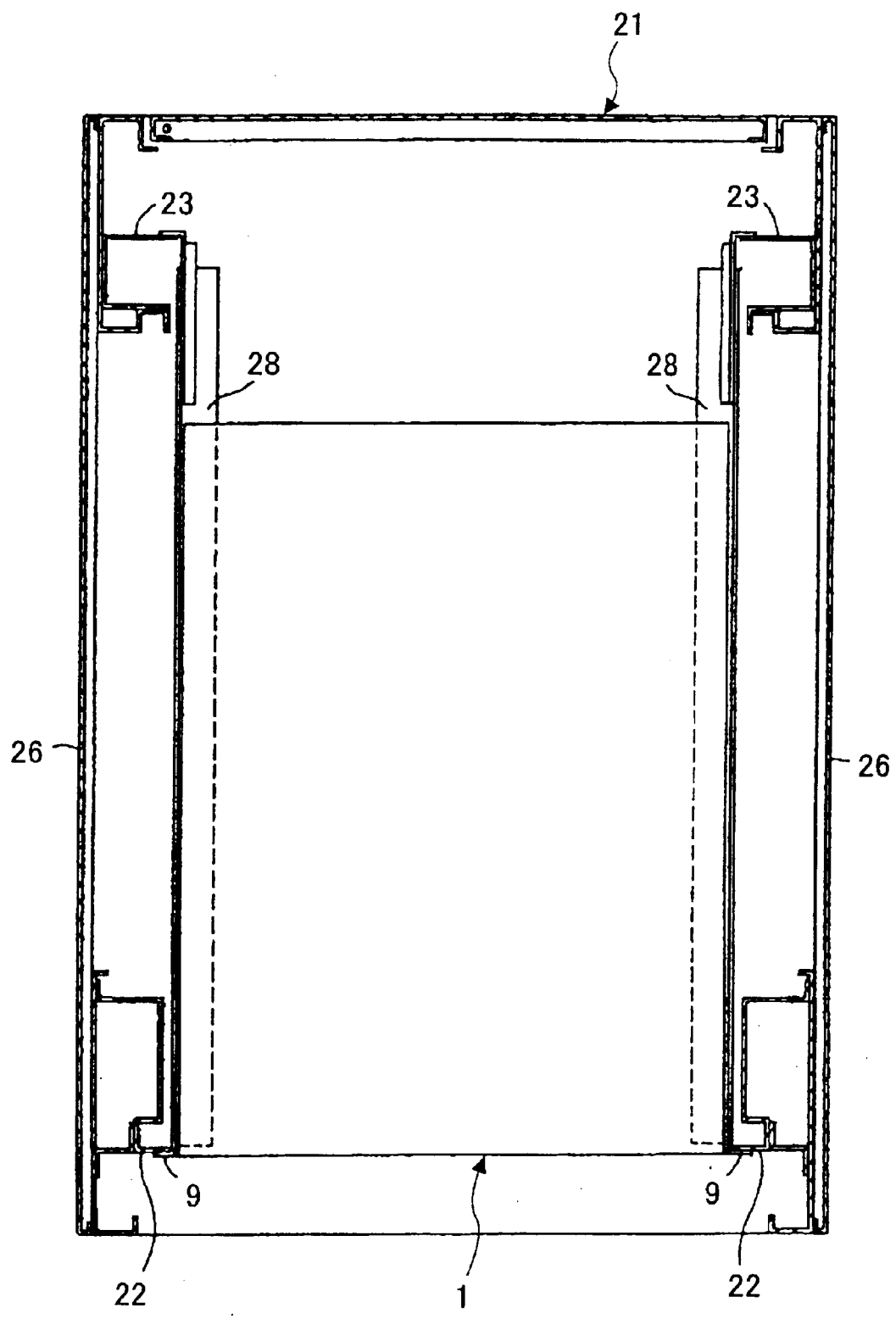
FIG. 5 is a cross sectional view of the rack shown in FIG. 4.
Figure 6:
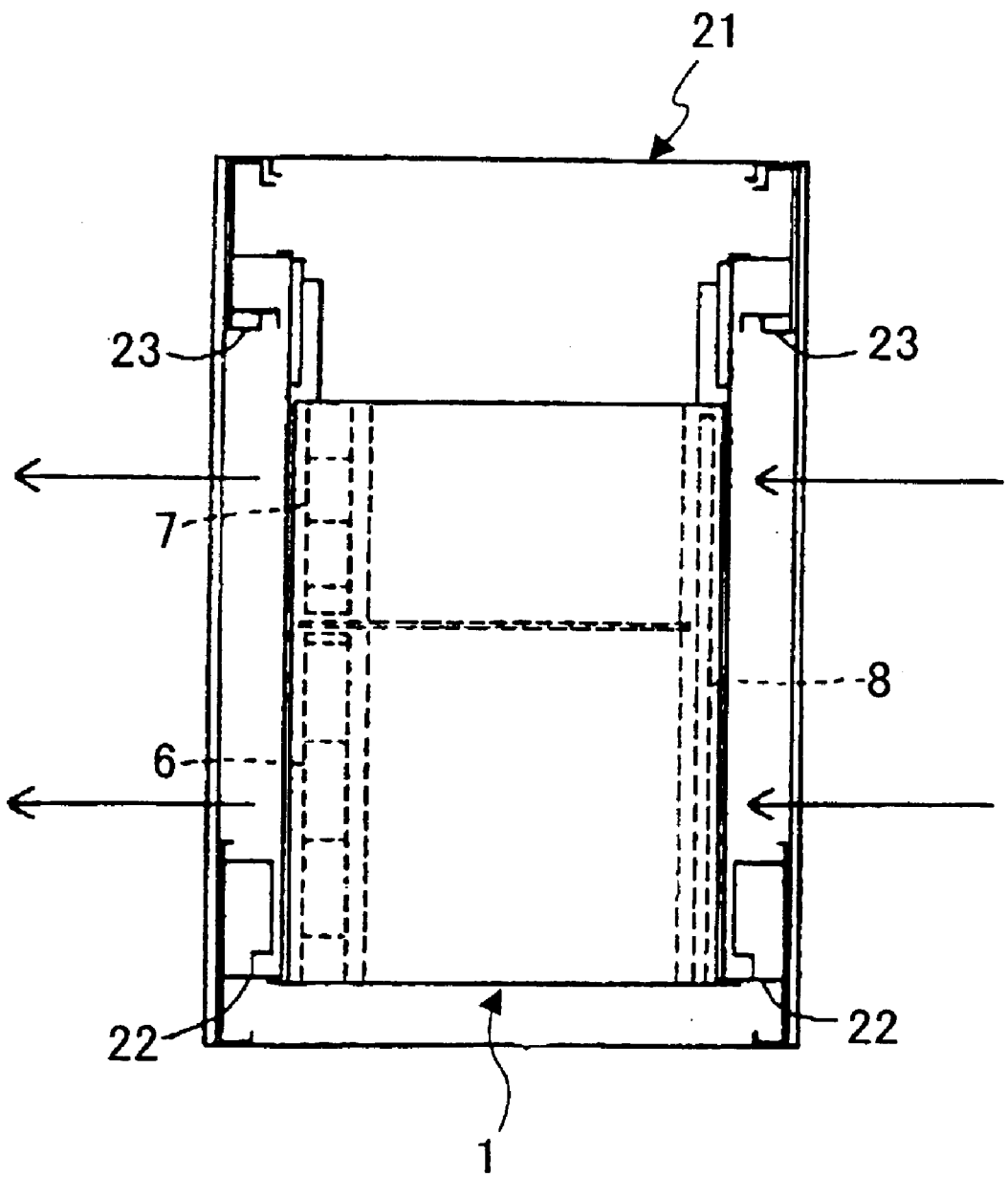
FIG. 6 illustrates cooling air flow in a structure in the related art.
Figure 7:
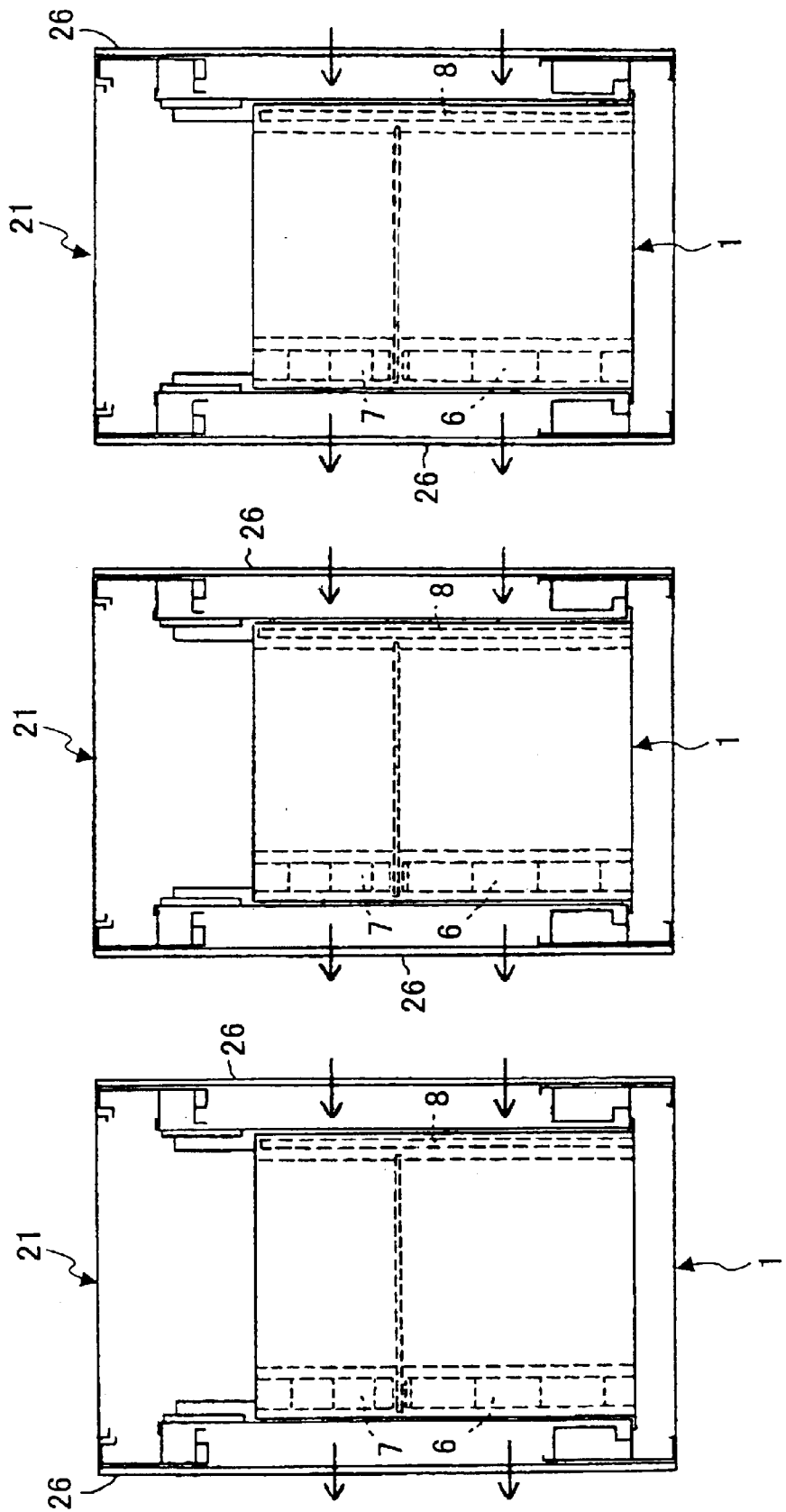
FIG. 7 is an illustration outlining problems to be solved by the present invention.
Figure 8:
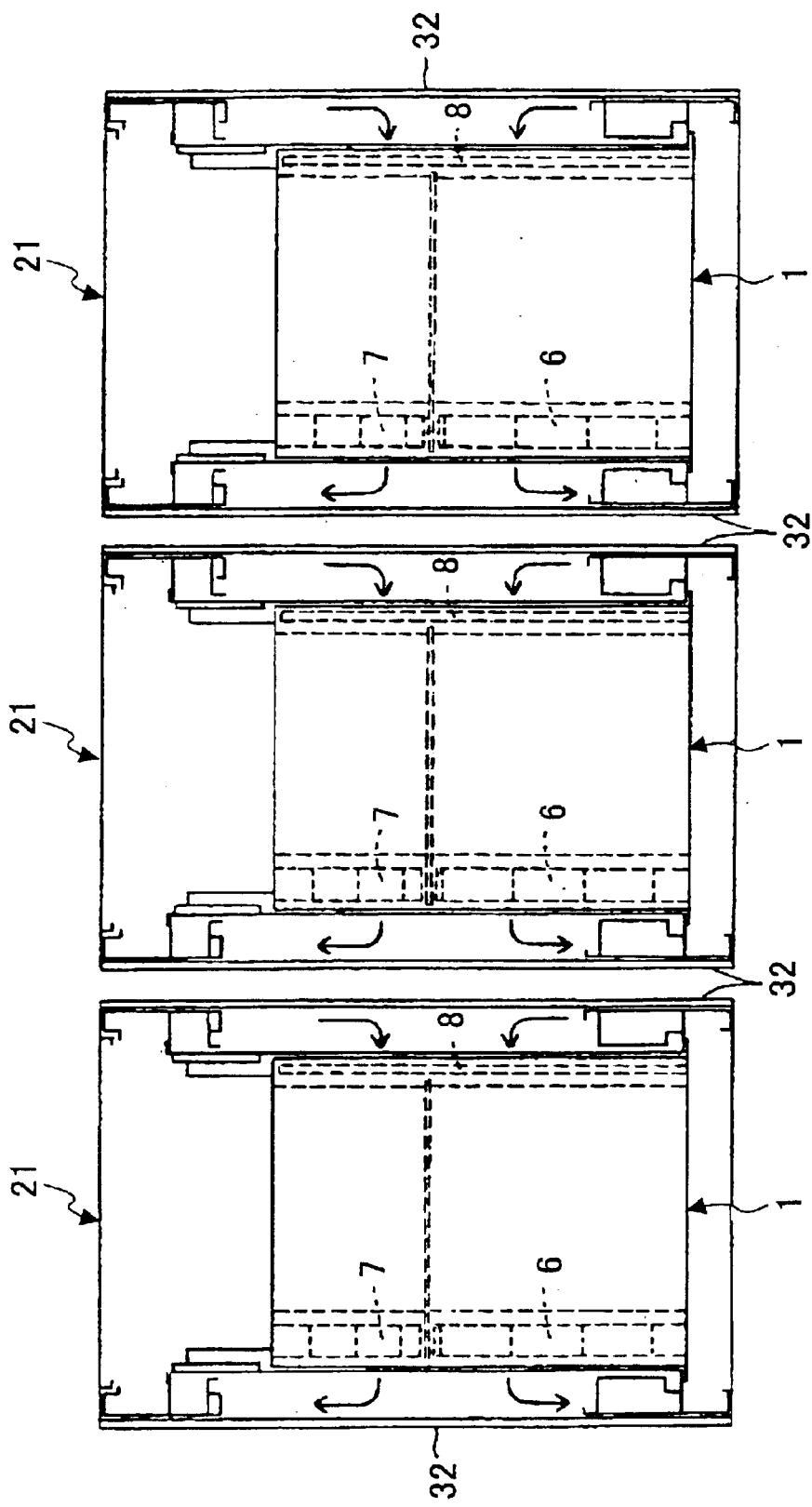
FIG. 8 is another illustration outlining the problems to be solved by the present invention.

The cooling of the electronic circuit unit by using the separation member 35 will now be described. Since a communication sub-unit for accommodating the electronic circuit unit is the same as that shown in FIGS. 1A, 1B and 2, the description of the communication sub-unit will be omitted. A rack for installing the separation member 35 is shown by a front view of FIG. 11. Since the basic structure is the same as that shown in FIG. 3, the same reference numerals will be used.

Figure 11:
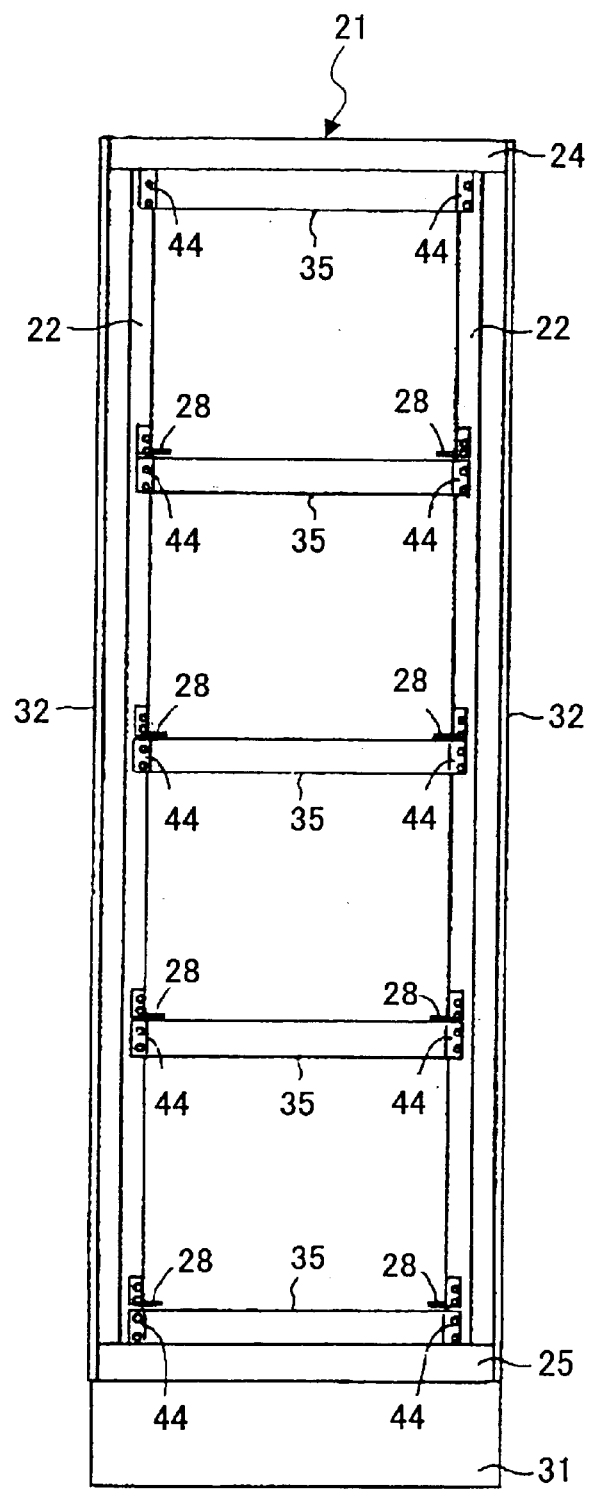
FIG. 11 is a front view of a rack to which the separation members of FIG. 10 are attached.

As shown in FIG. 11, a pair of rails are horizontally and right and left symmetrically attached to longitudinal frames 22 at a front side and longitudinal frames 23 at a back side. The resulting is that a plurality of pairs of rails are provided at predetermined intervals in a longitudinal direction. The pair of attaching surfaces 43 of the separation member 35 are attached against screw holes of the front side of the longitudinal frame 22 by inserting screws into attaching holes 44 and fastening them. The fitting metal 46 of this separation member 35 is fixed to the back side of the longitudinal frame 23 at the back side in the same manner. The separation member 35 is also attached at the most above portion of the rack 21. The communication device sub-units 1 are respectively inserted and installed in spaces between the rails 28 and the separation members 35 both of which are horizontally installed. Side covers 32, on which there are no air holes, are attached to the both sides of the rack 21.

A number of attaching holes for attaching the electronic circuit units 1, the rails 28, the separation members 35, and the like are arranged at predetermined intervals in a longitudinal direction on front surfaces of the longitudinal frames 22 at the front side of the rack 21 and on the back side of the longitudinal frame 23 at the back side of the rack 21. However, these attaching holes are not shown in FIG. 11 and other drawings for simplifying the illustrations.

The communication device sub-unit 1 is placed on each pair of rails 28 of the rack 21, and inserted into the rack 21. Then, the communication device sub-unit 1 is fixed to the front surfaces of the longitudinal frames 22 at the front side of the rack 21 by inserting screws into the attaching holes 11 of the attaching metals 9. This state is shown by a front view of FIG. 12. FIG. 13 is a plan and sectional view in a state of FIG. 12 where the communication device sub-units 1 have been inserted and fixed. FIG. 13 also shows the separation member 35. As understood from FIG. 13, the hypotenuse portion 39 of the separation member 39 is attached between the front surface of the longitudinal frame 22 at the left front side of the rack 21 in FIG. 13 and the back side of the longitudinal frame 23 at the right back side of the rack 21 in FIG. 13. Accordingly, the hypotenuse portion 39 partitions the space between the longitudinal frames 22 and 23 in an oblique direction. In other words, the hypotenuse portion 39 divides the inner space of the rack 21 into one space at the left side and the other space at the right side. The separation members 35 also separate spaces between the communication device sub-units 1 in a longitudinal direction.

In the above-described structure, following the activation of the communication device sub-unit 1, air generated by the first and second fan units 6 and 7 flows from the right side to the left side inside the communication device sub-unit 1. This air is then divided into the upward air flow and the downward air flow in FIG. 13 in the space defined by the left side cover 32, and the longitudinal frames 22 and 23 at the left front side and the left back side of the rack 21.

The air which has flowed into this space cannot flow to the front side of FIG. 13 because this space of the rack 21 is partitioned in the left and right direction. Accordingly, the air is guided along the hypotenuse portion 39 toward the back side as indicated by the solid arrows, and is discharged via air holes in the back door 27 of the rack 21 to the outside. Meanwhile, intake air for the inside of the communication device sub-unit 1 flows from an opening at the front side of FIG. 13, i.e., the front side of the rack 21 to an inside space of the separation member 35. Likewise, the air is guided by the hypotenuse portion 39 to spread in the inside without flowing toward the back side of the rack 21 as indicated by the dashed arrows. Then, the air flows into the space defined by the right side cover 32, and the longitudinal frames 22 and 23 at the right front side and the left back side of the rack 21. The communication device sub-unit 1 then takes in the air from a side portion thereof into the inside thereof via the air filter 8.

The above-described air flow and the like may be applied to the respective communication device sub-units 1, but all the intake air and discharge air may not be separated and guided by the separation member 35. While the air leak may occur due to the existence of little openings or chinks, almost all the air is guided in the divided manner. It is possible to prevent the air leak by closing the little openings or chinks by using appropriate closing members.

In this manner, the air flow as a cooling air flow is guided by one side surface of the hypotenuse portion 39 to flow into the communication device sub-unit 1 from the right side of the communication device sub-unit 1 so as to cool a heated electronic circuit unit. On the other hand, the air discharged from the left side of the communication device sub-unit 1 is guided toward the back side of the rack 21 by the other side surface of the hypotenuse portion 39. Accordingly, the intake air is securely guided from the front side of the rack 21, and the discharge air is securely guided to the back side of the rack 21, in a divided manner to prevent the intake air and the discharge air from being mixed. Thus, it is possible to realize an efficient cooling structure for the electronic circuit unit. With this structure, a plurality of racks 21 can be arranged in a row close to each other.

Figure 14:
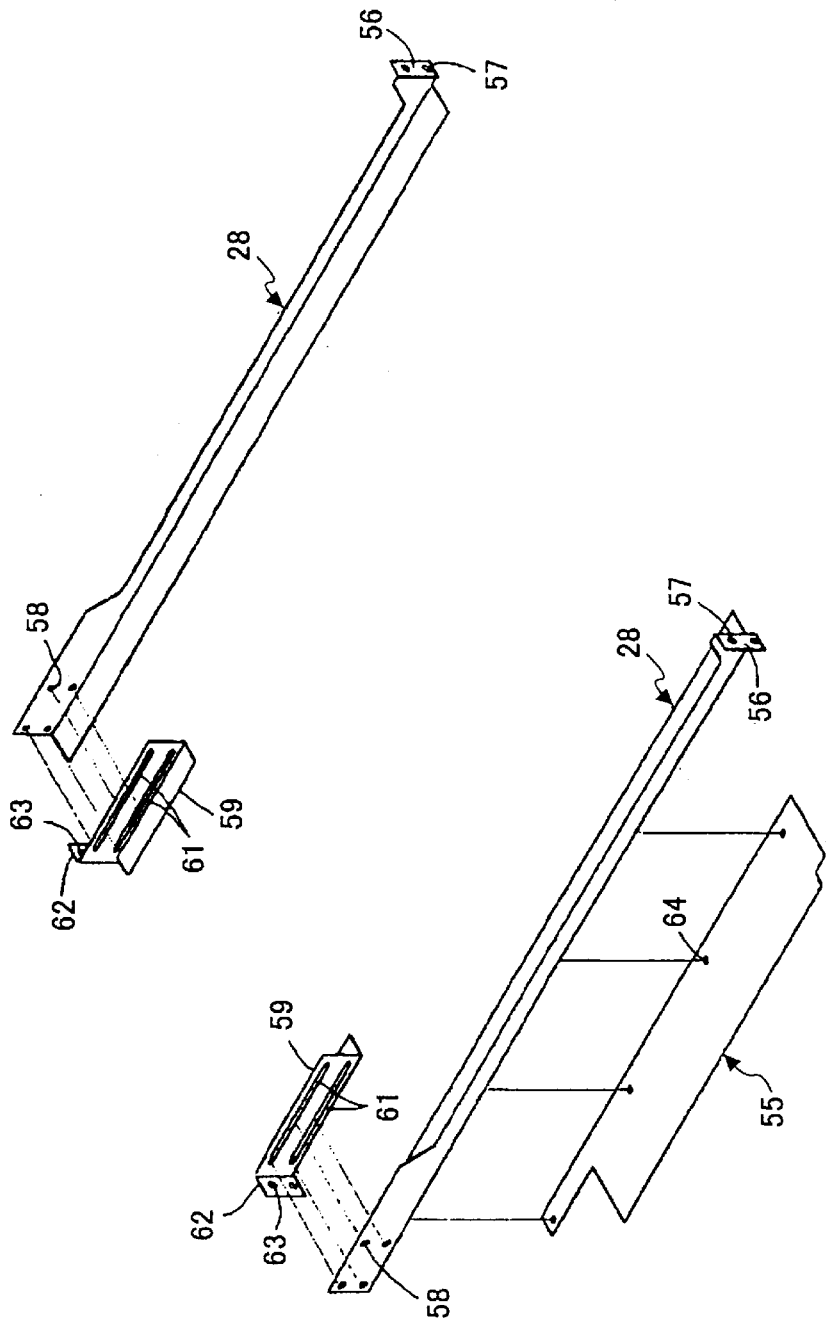
FIG. 14 illustrates one embodiment of a shielding member according to the present invention.

One embodiment of a shielding member which may be applied to the present invention will now be described with reference to FIG. 14. FIG. 14 is a perspective view of the shielding member in a separated state. This shielding member 55 is attached to one side of the above-described rail 28, i.e., a lower surface of the left side rail 28 when seen from the front side in FIG. 14 in this embodiment. As for a structure of the rail 28, as shown in FIG. 14, the rails 28 are L-shaped when seen from the front side, and symmetrical to each other. Screw inserting holes 57 for attaching the rails to the front side of the longitudinal frames 22 are formed on attaching surface 56 at the front side of the rail 28. A pair of these attaching surfaces 56 of the rails 21 spread in two directions as shown in FIG. 14. Four screw holes 58 are formed on a side surface at the back side of the rail 28.

In order to attach the rails 21 to the back sides of the longitudinal frames 23 at the back side of the rack 21, a pair of L-shaped fitting metals 59 are used, and two attaching slender holes are formed on a side surface of the fitting metal 59. Furthermore, screw holes 63 are formed on an attaching surface 62 for attaching the rail 28 to the longitudinal frame 23 at the back side of the rack 21. The shielding member 55 is an approximately rectangular-shaped sheet member, and has screw holes for attaching to the rail 28. The rail 28 has countersinks (or dish-shaped holes) at positions corresponding to the positions of the screw holes 64. A screw having a dish-shaped head or a tapered head is used for attaching the rail 28 to the shielding member 55, so that an upper surface of the rail 28, to which the shielding member 55 has been attached, has no projections and is flat. Therefore, there are no obstacles which prevent the communication device sub-unit 1 from being moved and inserted. Alternatively, instead of the screw, by using a rivet having a dish-shaped head or a tapered head, the rail 28 and the shielding member may be coupled. The rail 28, the fitting metals 59, and the shielding member 55 are made of sheet metal materials, e.g., stainless steel sheets.

Figure 15:
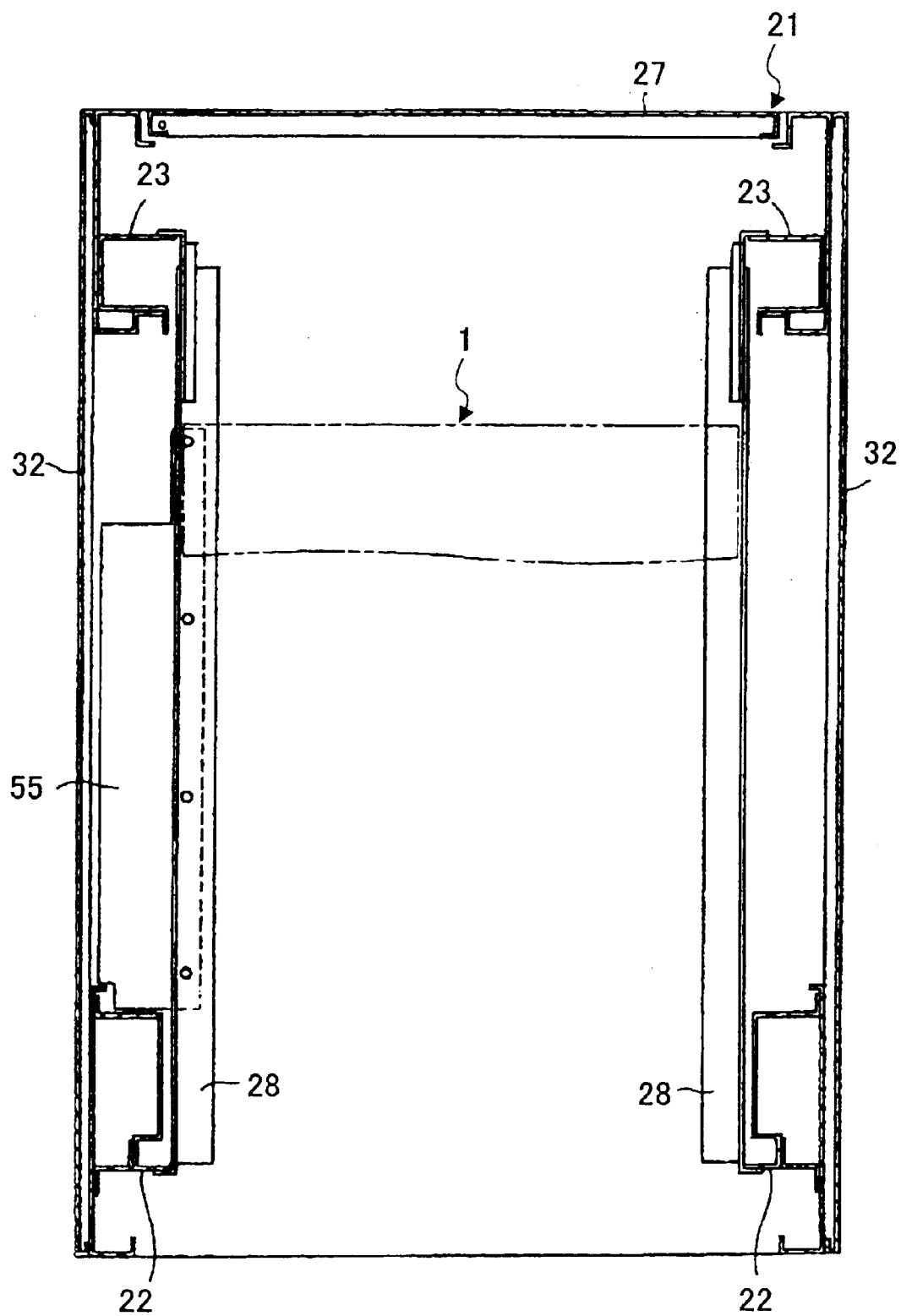
FIG. 15 is a cross sectional view of the rack to which the shielding member of FIG. 14 is attached.

In order to attach and fix the rail 28 to the rack 21, the fitting metal 59 is attached and connected to the rail 28 by screws. The position of the slender attaching holes 61 of the fitting metal 59 is adjusted so as to position and fix the rail 28 between the longitudinal frame 22 at the front side of the rack 21 and the longitudinal frame 23 at the back side of the rack 21. FIG. 15 is a plan and sectional view of the rack 21 in a state in which the rails 28 have been attached in the above-described manner. The shielding member 55 projects so as to be at a position close to the an inner surface of a side cover 32 of the rack 21 at the left side. A front portion of the shielding member 55 is close to the longitudinal frame 22 at the front side of the rack 21. Meanwhile, a rear portion of the shielding member 55 is positioned such that a space between the rear portion of the shielding member 55 and the longitudinal frame 23 is formed with an appropriate interval therebetween. This space is secured for arrangement of cables which are provided in the space between the rail 28 and the side cover 32 in a longitudinal direction.

In FIG. 15, a back side of the communication device sub-unit 1 is shown by the two dotted chain line between a pair of rails. In other words, the shielding member 55 is arranged at the position corresponding to the position of the fans 12 and 13 of the first fan unit 6 and the second fan unit 7.

An effect of the separation member 55 in the above-described structure will now be described with reference to FIG. 15. Discharge air from the first communication device sub-unit 1 inserted and disposed above the shielding member 55 cannot flow to the lower side of this subunit 1 due to existence of the shielding member 55. As a result, the discharge air is discharged to the outside by the separation member 55 located above this communication device sub-unit 1.

Air discharge from the second communication device sub-unit 1 inserted and disposed below this shielding member 55 is prevented from flowing to the above side of this shielding member 55 by existence of this shielding member 55. Likewise, this discharge air is discharged to the outside at the back side of the second communication device subunit 1 by the separation member 35 directly below the first subunit 1, i.e., the separation member 35 located at the upper side of the second communication device sub-unit 1. In this manner, by providing the shielding member 55, air from the first communication device sub-unit 1 at the upper side and air from the second communication device sub-unit 1 at the lower side are not mixed, and are discharged separately to achieve effective air discharge. Since wiring cables exist (not shown) in a vertical direction in a space between the shielding member 55 and the longitudinal frame 23 at the back side of the rack 21, less discharge air from one air discharge area flows into another air discharge area via this space.

Figure 16:
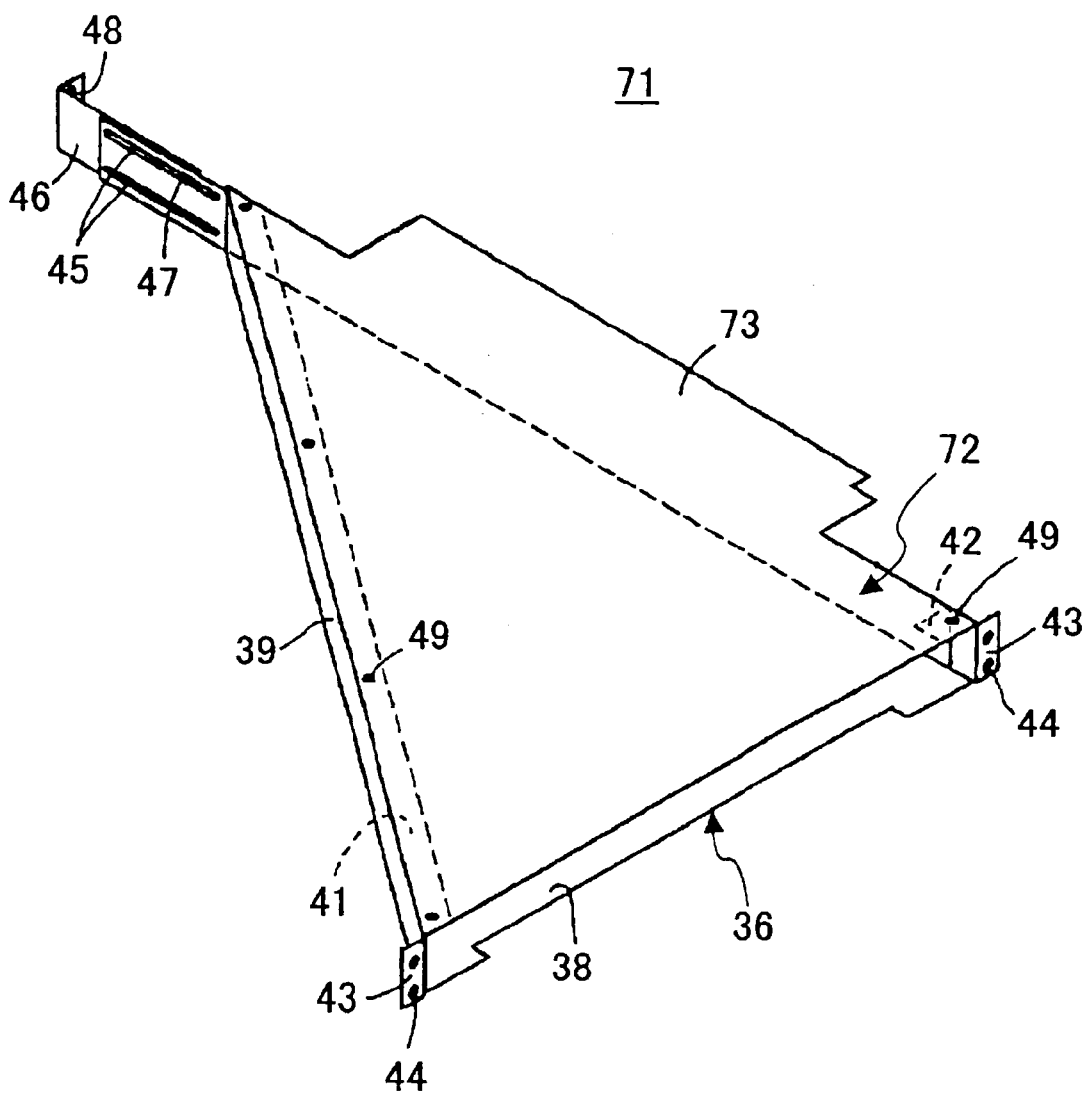
FIG. 16 is a perspective view of a second embodiment of the separation member.

FIG. 16 is a perspective view of a second embodiment of a separation member applied to the present invention, and shows the assembled separation member 71. A basic structure of the separation member 71 is the same as that shown in FIGS. 9 and 10, so the same reference numerals are used. The separation member 71 includes a body part 36 at the lower side of this figure, and a flat cover sheet 72 at the upper side. The body part 36 and the cover sheet 72 are made of sheet metal materials, such as stainless steel sheets.

A bottom surface sheet 38 of the body part 36 has a shape of a right triangle. A hypotenuse portion 39 is bent so as to stand upright at a right angle from the bottom surface sheet 38, and bent at another part along an upper surface so as to form a band portion 41 which is in parallel with the bottom surface sheet 38. An attaching surface 42 whose one end is bent to be hook-shaped is formed on a right-angled portion of the bottom surface sheet 38 which faces the hypotenuse portion 39. Furthermore, a pair of attaching surfaces 43 are bent and formed respectively at the right-angled portion and a place on the hypotenuse portion 39 which faces this attaching surface 42. The pair of attaching surfaces 43 extend in two directions as shown in FIG. 16, and are provided with attaching holes 44.

A part of the hypotenuse portion 39 opposite the attaching surface 44 extends along the base of the triangle, and is provided with two slender attaching holes 45. An L-shaped fitting metal 46 is attached against the slender attaching holes 45 by means of screws via screw holes 47 on the fitting metal 46, and the other surface of the L-shaped fitting metal 46 is provided with attaching holes 48. Attaching holes 49 are formed on the band portion 41 and the attaching surface 42 of the body part 36, a portion along a hypotenuse of the cover sheet 72, and a portion of the cover sheet 72 corresponding to the position of the right-angle portion, respectively. The body part 36 and the cover sheet 72 are combined with each other by applying, for example, known blind rivets to these attaching holes 49, and are attached and fixed to each other to form the assembled separation member 71 in a caulking manner as shown in FIG. 16.

Similarly to the above-described separation member 35, openings are formed at a front side and a right side of the separation member 71 in FIG. 16, and the hypotenuse portion 39 is closed, so that the separation member 71 can function as a so-called duct. As for a particular shape of the separation member 71, a right side of the cover member 72 in FIG. 16 is provided with a shielding member having an approximately rectangular shape and extending from the right side of the cover member 72. The following description is directed to cooling of an electronic circuit unit by using the separation member 71. Since a communication device sub-unit is the same as that shown in FIGS. 1A, 1B and 2, the description of the communication device sub-unit will be omitted.

Figure 17:
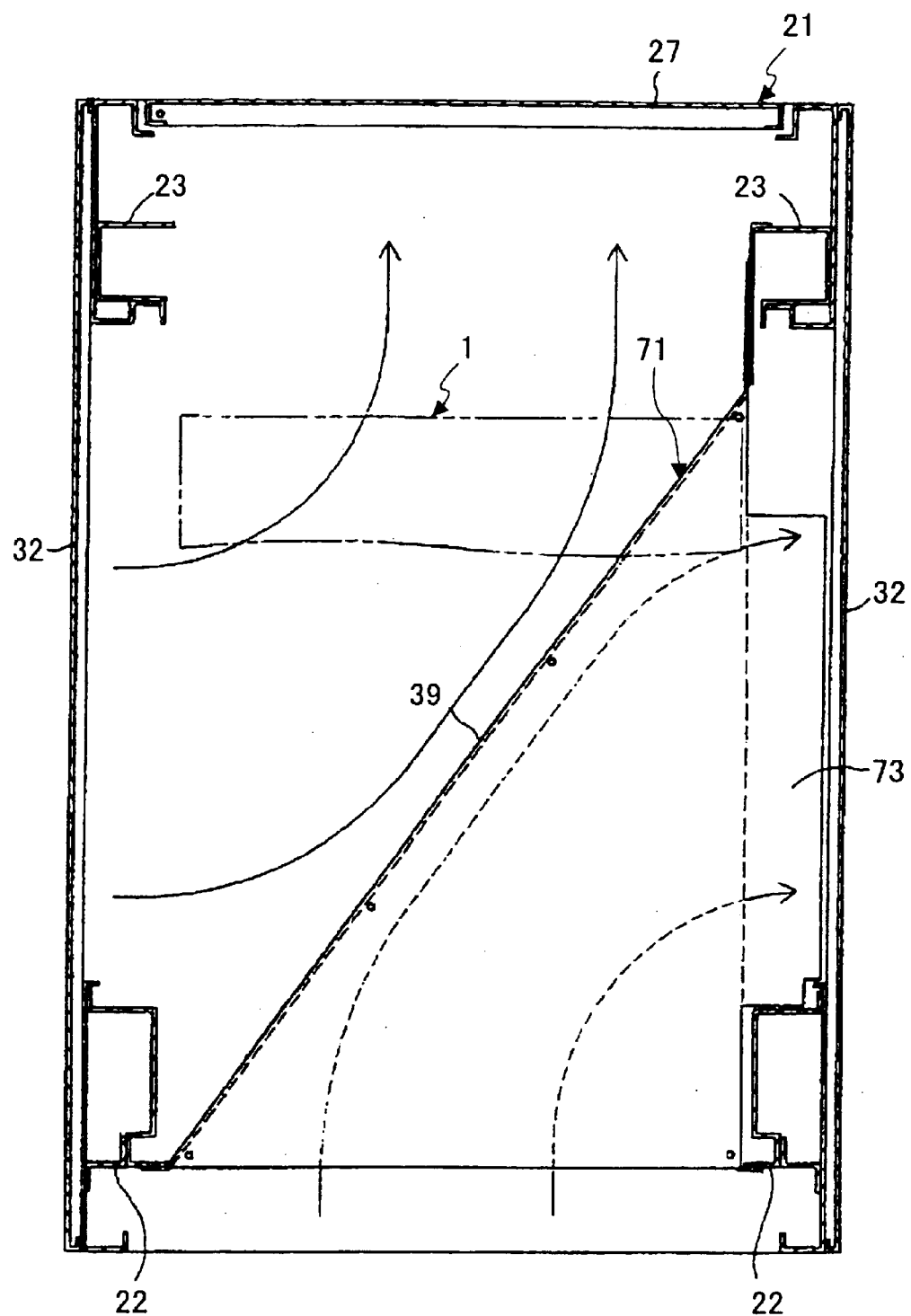
FIG. 17 is a cross sectional view of the rack to which the separation member of FIG. 16 is attached.

A rack to which the separation member 71 is attached is understood by referring to the above description related to FIG. 11. FIG. 17 is a plan and sectional view of the rack 21 in a state where the separation member 71 is attached to the rack 21. In FIG. 17, the rails 28 are not shown, and the back part of the communication device sub-unit 1, which has been inserted and attached, is shown by a two-dotted chain line as in the same manner of FIG. 12.

Figure 10:
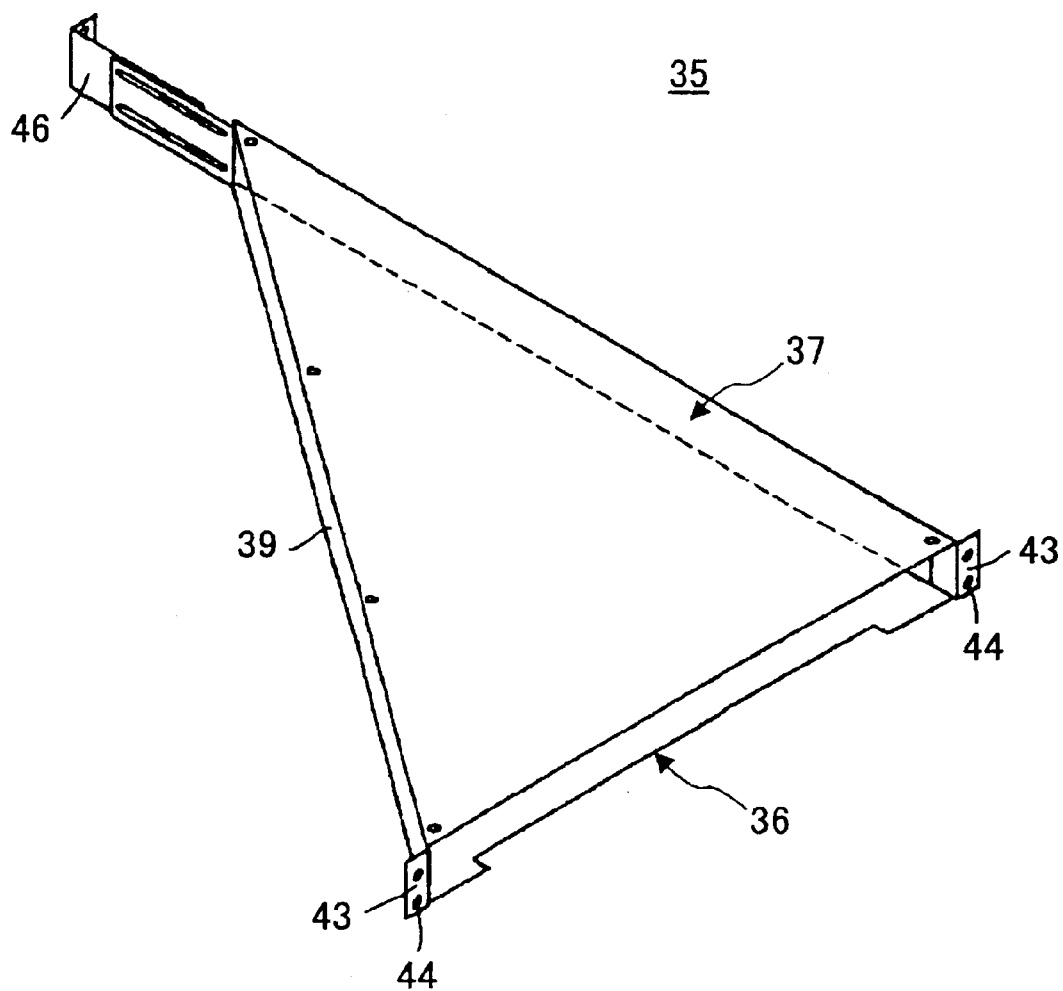
FIG. 10 is a perspective view of the separation member of FIG. 9, and shows an assembled state.

As in the case of the separation member 35 of FIGS. 10 and 13, the hypotenuse portion 39 of the separation member 71 is attached between a front surface of the longitudinal frame 22 at the left front side of the rack 21 and a back surface of the longitudinal frame 23 at the right back side of the rack 21 in FIG. 17. Accordingly, the hypotenuse portion 39 partitions this space between the longitudinal frames 22 and the longitudinal frames 23 in an oblique direction. In other words, one side of an inner space of the rack 21 is partitioned from the other side of the inner space of the rack 21 by means of the hypotenuse portion 39. In addition, by existence of the separation member 71, a space between the communication device sub-unit 1 at the upper side and the communication device subunit at the lower side are separated from each other.

The shielding member 73 of the separation member 71 projects so as to be close to an inner surface of the side cover 32 at the right side of the rack 21. A front side of the shielding member 73 is close to the longitudinal frame 22 at the front side of the rack 21 while a back side of the shielding member 73 is spaced from the longitudinal frame 23 at the back side of the rack 21 to provide a space therebetween. As in the case of FIG. 15, this space between the rail 28 (not shown) and the side cover 32 is secured for providing wiring cables (not shown) vertically.

Similarly to the case of FIG. 13, air flow generated by activation of the first and second fan units 6 and 7 which accompanies activation of the communication device sub-unit 1 passes through the inside of the communication device sub-unit 1 from the right side to the left side of FIG. 17. The air flow is then separated into upward air flow and downward air flow in a space formed by the longitudinal frames 22 and 23 at the left side of the rack 21 and the side cover 32 at the left side of the rack 21. Then, the separated air flows enter spaces at the upper side and the lower side of the communication device sub-unit 1, respectively, i.e., enter the spaces where the separation members 71 exist.

The air which has flowed into each of these spaces where the separation members 71 exist cannot enter the front side of FIG. 17 because the space in the rack 21 is separated right and left by the separation member 71. Accordingly, the air is guided along each of the hypotenuse portions 39 toward the back side of the rack 21 as indicated by the solid arrows in FIG. 17. As a result, the air is discharged to the outside from air holes in the back door 27 of the rack 21. On the other hand, intake air flows into the inside space of the separation member 71 from the front opening of the rack 21. Likewise, the intake air cannot flow to the back side of the rack 21 due to existence of the hypotenuse portion 39. The intake air spreads into the inside, and is guided to the right side of the rack 21 by the hypotenuse portion 39. As a result, the intake air flows from the right side opening of the separation member 71 into a space formed by the longitudinal frames 22 and 23 at the right side of the rack 21 and the side cover 32 at the right side of the rack 21, and then is taken in from the side of the communication device sub-unit 1 to the inside thereof via the air filter 8.

Since the intake air is prevented from flowing upwards by the shielding member 73, this intake air flow is provided only to the communication device sub-unit 1 at the lower side of this shielding member 73. The above-described air flow and the like is applied to each of the communication device sub-unit 1. The intake air flow and the discharge air flow may not be necessarily completely separated and guided, and leakage may occur because there are tiny chinks or holes. However, almost all the air flow is separated and guided, but appropriate closing members may be provided for closing these tiny chinks or holes in order to prevent air leakage.

In the above-described manner, the cooling air which flowed into the inside of the separation member 71 via the front side is guided by one side surface of the hypotenuse portion 39 to flow into the inside of the communication device sub-unit from the right side thereof in FIG. 17. The electronic circuit unit having generated heat is thereby cooled by this cooling air. The discharge air is guided by the other side surface of the hypotenuse portion 39 to the back side of the rack 21. The intake air at the front side of the rack 21 and the discharge air at the back side of the rack 21 are securely separated, and not mixed. In this manner, it is possible to achieve an efficient cooling structure for the electronic circuit unit, and to thereby arrange a plurality of racks 21 in a row with the racks 21 being close to each other.

Figure 18:
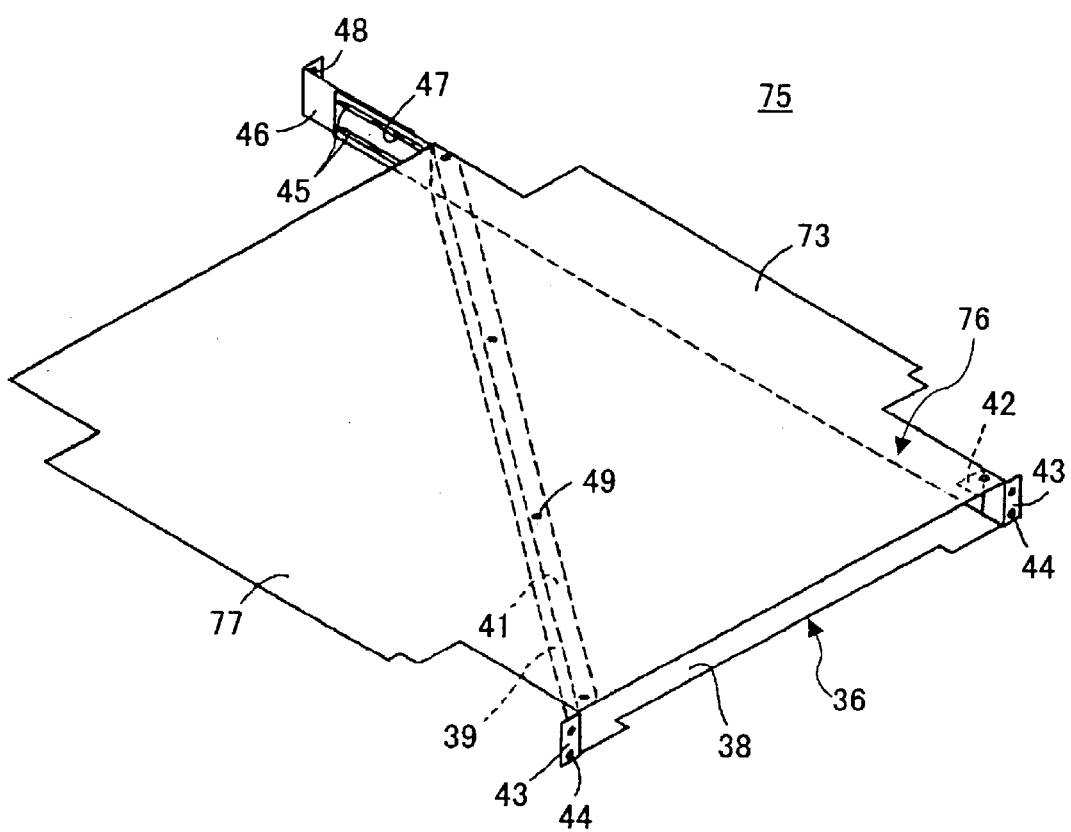
FIG. 18 is a perspective view of a third embodiment of the separation member.

FIG. 18 is a perspective view of a third embodiment of the separation member according to the present invention, and shows an assembled state of the separation member 75. In FIG. 18, a basic structure of the separation member 75 is the same as that of FIG. 13, and the same reference numerals are used. The separation member 75 includes a body part 36 at the lower side in FIG. 18 and a cover sheet 76 at the upper side. The body part 36 and the cover sheet 76 are made of sheet metal materials such as stainless steel sheets.

A bottom surface 38 of the body part 36 has a shape of a right triangle. A hypotenuse portion 39 is bent from the bottom surface 38 so as to stand upright at a right angle, and is bent at another part so as to form a band portion 41 which is in parallel with the bottom surface 38. A standing portion whose upper part is bent to have a hooked shape is provided at a right-angled portion on the bottom surface 38 opposite the hypotenuse portion 39. The standing portion includes an attaching surface 42. A pair of attaching surfaces 43 are formed at the standing portion and at a position of the hypotenuse portion which faces a position of the attaching surface 42 so as to extend in two directions, respectively as shown in FIG. 18. Attaching holes 44 are formed on the attaching surfaces 43, respectively.

The hypotenuse portion 39 opposite the attaching surface 44 extends along the base of the triangle. An extended part of the hypotenuse portion 39 has two slender holes 45. An L-shaped fitting metal 46 has attaching holes facing the slender holes 45 which are attached against this extended part. As shown in FIG. 18, attaching holes 48 are formed on the other surface of the extended part of the hypotenuse portion 39. Attaching holes 49 are formed on the band portion 41 and the attaching surface 42 of the body 36, and a diagonal part and a right-angled part, which faces the attaching surface 42, of the cover sheet 76, respectively. The body part 36 and the cover sheet 76 are coupled by applying, for example, known blind rivets to these attaching holes 49, and fixed to each other by using a caulking technique. In this manner, the separation member 75 is assembled as shown in FIG. 18.

The separation member 75 has openings at the front side and at the right side in FIG. 18, and the hypotenuse portion 39 is closed. Accordingly, this separation member 75 is a so-called duct. As for a particular structure, the cover sheet 76 has an approximately rectangular shape or shape of a square, and rectangular portions which project from the right and left sides of the cover sheet 76, respectively are provided as shielding members 73, 77.

Effects and advantages in the cooling of the electronic circuit unit by using the separation member 75 are substantially the same as those which are achieved by integrally using both of the shielding member 55 of FIGS. 14 and 15 and the shielding member 71 of FIGS. 16 and 17. Accordingly, the combination of the rail 28 and the shielding member 55 may be replaced with the rail 28 not having the shielding member 55, by using the shielding member 75. A plan and sectional view of the rack 21 to which the separation member 75 has been inserted is omitted, but will be understood as combining with the invention of FIGS. 15 and 17.

Figure 19:
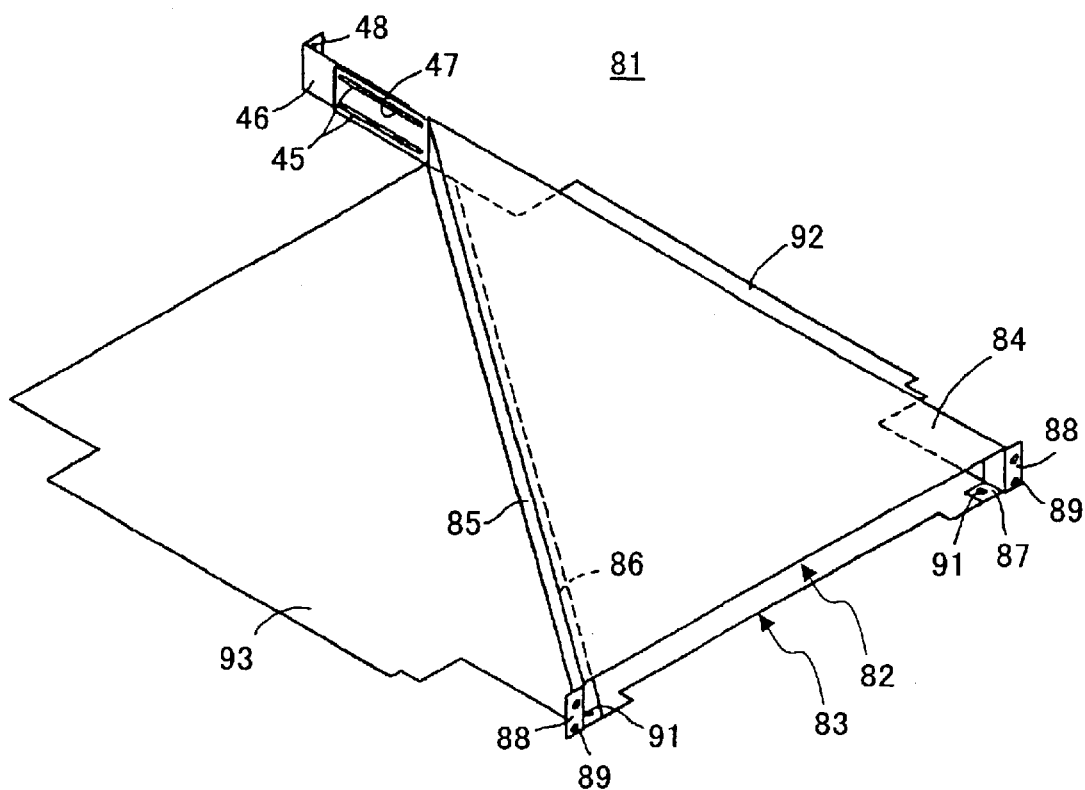
FIG. 19 is a perspective view of a fourth embodiment of the separation member.

FIG. 19 is a perspective view of a separation member 81 of a fourth embodiment according to the present invention, and shows an assembled state of the separation member. A basic structure of the separation member 81 in FIG. 19 is similar to that of the separation member in FIG. 18. However, in FIG. 19, a shielding member is provided at an lower side of the separation member 81 while the shielding member of FIG. 18 is provided at an upper side of the separation member 75. The separation member 81 includes a body part 82 at the upper side of FIG. 19 and a bottom sheet 83 at the lower side, both of which can be made of stainless steel sheets.

An upper surface sheet 84 of the body part 82 has a shape of a right triangle. A hypotenuse portion 85 is bent so as to extend downwards at a right angle relative to the upper surface sheet 84. This hypotenuse portion 85 is bent at another part so as to form a band portion 86 which is in parallel with the upper surface sheet 84. An attaching surface 87 whose one side is bent to have a hooked shape is provided at a lower part of a right-angled portion which faces the hypotenuse portion 85 and which belongs to the upper surface sheet 84. A pair of attaching surfaces 88, at the side of the attaching surface 87 and the side of the hypotenuse portion 87 opposite the attaching surface 87, are bent and formed so as to extend towards both directions. Attaching holes 89 are formed on this pair of attaching surfaces 88, respectively.

As shown in FIG. 19, the other side of the hypotenuse portion 85 extends along the base of the triangle, and two slender attaching holes 45 are formed on this extended part of the hypotenuse portion 85. An L-shaped fitting metal 46 has screw holes 47 so that the L-shaped fitting metal may be attached against the slender attaching holes 45 by means of screws. In addition, the other surface of the L-shaped fitting metal 46 has attaching holes 48. Attaching holes 91 are formed on the band portion 86 and the attaching surface 87 at the body part 82, and a part on or near a diagonal and a right-angled portion at the bottom sheet 83. The body part 82 and bottom sheet 83 are combined and fixed to each other by using known blind rivets and by caulking. In this manner, the separation member 81 is assembled as shown in FIG. 19.

Likewise, this separation member 81 has openings at the front side and the right side in FIG. 19. The hypotenuse portion 85 is a so-called closed duct. The separation member 81 has a feature in that the bottom sheet 83 has an approximately square shape, and projected rectangles which function as a pair of shielding members 92 and 93 formed on the right and left sides of the bottom sheet 83. By using this separation member 81, it is possible to attain effects and advantages which are substantially equal to those in the case where the shielding member 55 described above by referring to FIGS. 14 and 15 are integrated with the separation member 71 described above by referring to FIGS. 16 and 17. Furthermore, the effects and advantages of the separation member 81 is substantially equal to those of the separation member 75 described above by referring to FIG. 18. Accordingly, in the case where the separation member 81 is used, the rail 28 to which the shielding member 55 has been attached can be replaced with the rail 28 to which the shielding member is not attached. The drawing for the rack 21 to which the separation member 81 has been inserted is omitted, but will be understood.

Figure 20:
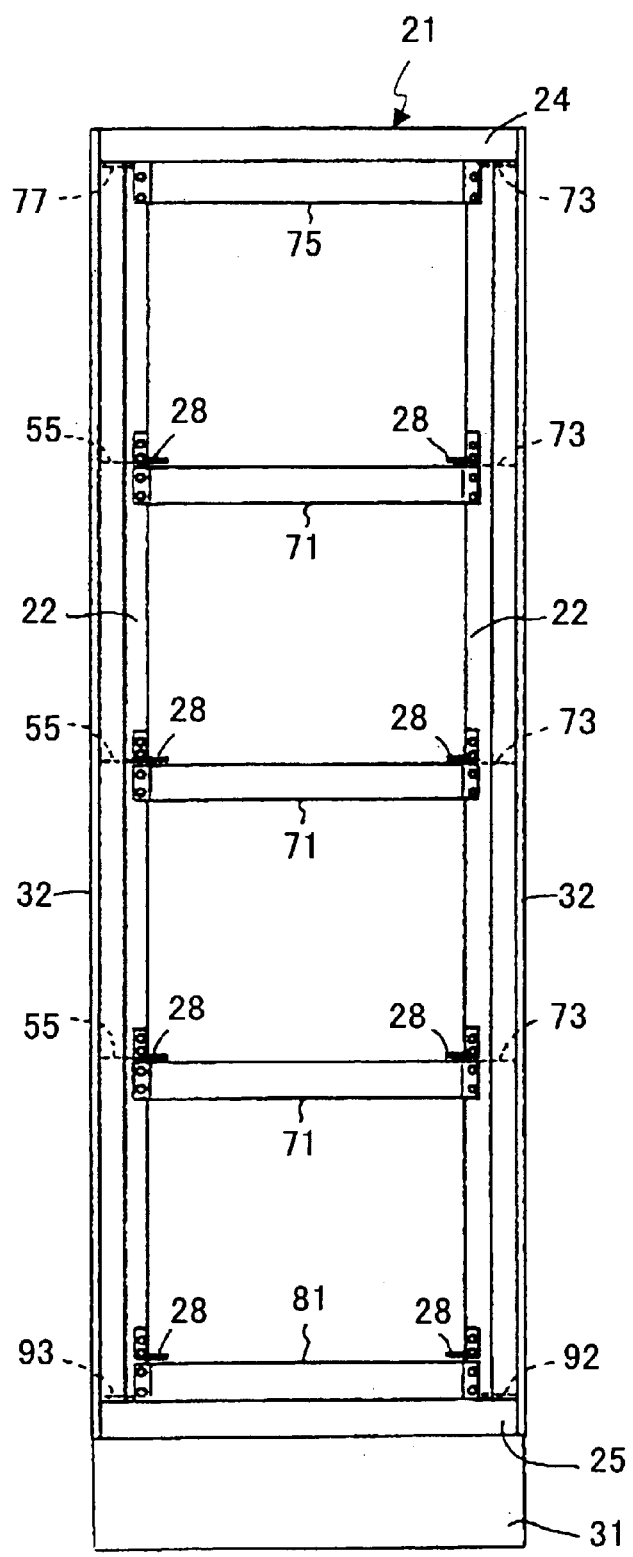
FIG. 20 is a front view of the rack to which the separation members and the shielding members are attached according to the present invention.

FIG. 20 is a front view of one embodiment of the rack 21 to which various separation members and shielding members described above have been attached. Advantages and operation of this rack 21 will be described with reference to FIG. 20, but the communication device subunit 1 is omitted. The separation member 75 is attached at a first part from above, the separation members 71 are attached at second, third and fourth parts, and the separation member 81 is attached at the last part of the rack 21.

The rails 28 are attached at the upper side of the separation members and at locations close to the separation members such that the rails 28 are symmetric with respect to right and left sides. The pair of rails 28 which do not include the shielding member 55 is attached at the last part, and the pair of rails 28 which include the shielding member 55 are attached at the second, third and fourth parts of the rack 21. With this structure, the description for inserting the communication device subunits 1 on the rails 28 is the same as that of FIG. 12.

The effects and advantages are described on the assumption that the communication device subunits 1 have been inserted in the rack 21 of FIG. 20. As for the communication device subunit 1 at the most above side, air is taken in from the front side of the separation member 75 at the upper side of this communication device subunit 1, and the cooling air passes through the inner part of the communication device subunit 1 from the right side to the left side thereof, and is discharged to the back side of the rack 21 by this separation member 75.

The air intake and discharge for the most above side situated subunit 1 (also referred to as the first subunit 1) is carried out only by the separation member 75 at the upper side of this subunit 1. The reason for this is as follows. Since the right and left shielding members 73 and 77 shut off an air path to a space below the ceiling member 24 of the rack 21, the air does not flow into this space. The discharge air does not flow into the intake air side. In addition, the shielding member 55 of the rail 28 and the shielding member 73 of the separation member 71 at the lower side of the first subunit 1 shut off an air path to a lower space of the first subunit 1.

As for each of the communication device subunits 1 (also referred to as the second and third subunits 1) which are situated on the second and third levels from the top of the rack 21, the air intake and discharge for each of the second and third subunits 1 is performed only by the separation member 71 at the upper side of each of the second and third subunits 1. The reason for this is as follows. Regarding the second subunit 1, for example, the shielding member 55 of the rail 28 at the upper side of the second subunit 1 and the shielding member 73 of the separation member 71 at the upper side of the second subunit 1 shut off an air path to an upper side of the second subunit 1. On the other hand, the shielding member 55 of the rail 28 at the lower side of the second subunit 1 and the shielding member 73 of the separation member 71 below the second subunit 1 shut off an air path to a lower side of the second subunit 1. This description also applies to the third subunit 1.

According to this embodiment, as for the communication device subunit 1 (also referred as to the last subunit 1) at the bottom, the air intake and discharge for the last subunit 1 is performed by the separation member 71 at the upper side of the last subunit 1 and by the separation member 81 at the lower side of the last device subunit 1. The reason for this is as follows. The shielding member 55 of the rail 28 at the upper side of the last subunit 1 and the shielding member 73 of the separation member 71 at the upper side of the last subunit 1 shut off an air path to the upper side of the last subunit 1. The shielding members 92 and 93 of the separation member 81 shut off an air path to the lower side of the last subunit 1. In this case, since the air path to a lower space below a bottom sheet member 25 of the rack is shut off by the shielding members 92 and 93 of the lower side of the last subunit 1, the air does not flow into this space, and thereby, it is possible to prevent the discharge air from flowing into the air intake side.

In the above-described embodiment, the rails 28 having the shielding members 55 are applied to the second, third and fourth levels from the top of the rack 21, but the combination of the rail 28 and the shielding member 55 can be replaced with the separation member 75 having the shielding members 73 and 75 at the both sides thereof. Of course, instead of using the separation member 71 having the shielding member 73, it is possible to use the separation member 35 which does not have the shielding member, by using the rail 28 at the right side in FIG. 20 which has the shielding member 55 as well as the rail 28 at the left side in FIG. 20 which has the shielding member 55 as described above.

Figure 21:
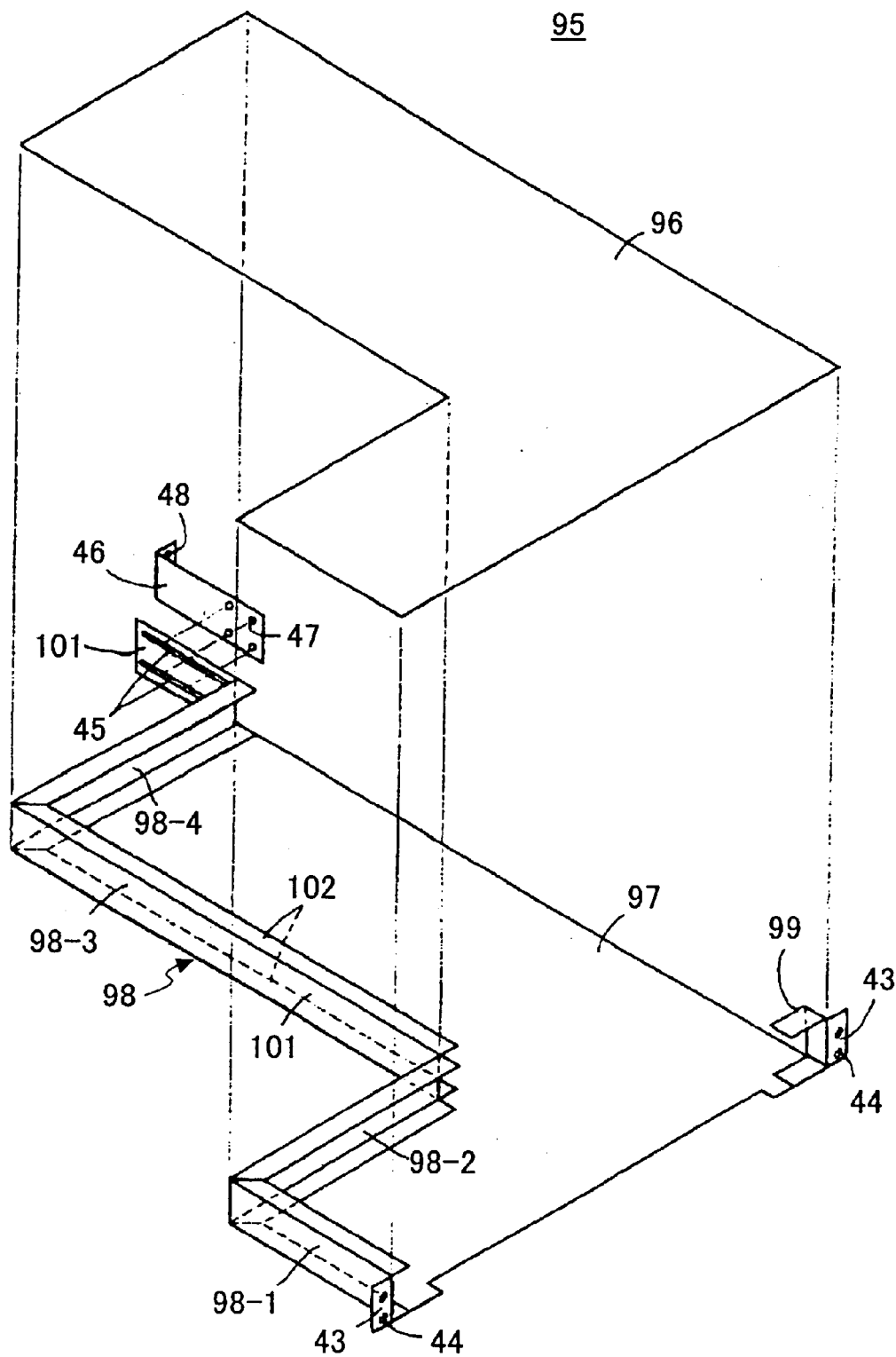
FIG. 21 is a perspective view of a fifth embodiment of the separation member.

FIG. 21 is a perspective view of a fifth embodiment of a separation member applied to the present invention, and shows a separated state of the separation member 95. The separation member 95 includes an upper surface sheet 96 and a bottom surface sheet 97, both of which are made of sheet metal materials such as stainless steel sheets. The upper surface sheet 96 and the bottom surface sheet 97 have the same shape which is approximately L-shaped. The separation member 95 further includes a shielding sheet 98 for separating the left side and the back side of the separation member 95, and a U-shaped connecting metal 99 for connecting at a right-angled corner of the right and front side.

The shielding sheet 98 is bent so as to form parallel surfaces 102. In other words, the shielding sheet 98 is bent to be U-shaped and groove-shaped such that both sides (i.e., the parallel surfaces 102) of a vertical surface 101 are in parallel with each other. A shielding portion 98-1 which is a first front-to-back portion extending from the front side to the back side, a shielding portion 98-2 which is a first left-to-right portion extending from the left side to the right side by being bent at a right angle, a shielding portion 93-3 which is a second front-to-back portion extending from the front side to the back side by being bent at a right angle, a shielding portion 98-4 which is a second left-to-right portion extending from the left side to the right side by being bent at a right angle, and a vertical surface 101 provided at an end of the shielding portion 98-4 are formed integrally and continuously. The vertical surface 101 provided at the end of the shielding portion 98-4 has two slender attaching holes 45.

Screw holes 47 are formed on an L-shaped fitting metal 46 in order to attach the L-shaped fitting metal 46 against the slender attaching holes 45 by means of screws. Attaching holes 48 are formed on the other surface of the L-shaped fitting metal 46. A pair of attaching surfaces 43 whose one sides are bent are provided at the connecting metal 99 and the front-to-back shielding portion 98-1 opposite the connecting metal 99, respectively so as to extend to both directions which are opposite to each other. A pair of the attaching surfaces 43 have attaching holes 44, respectively.

Attaching holes (not shown) are formed on the parallel surface 102 of the shielding sheet 98, a contacting portion of the upper surface sheet 96 which contacts with this parallel surface 102, and a contacting portion of the bottom surface sheet 97 which contacts with the parallel surface 102, at appropriate intervals. Furthermore, similar attaching holes are formed on a contacting surface of the connecting metal 99 and a contacting portion of the upper surface sheet 96 which contacts with the contacting surface of the contacting metal 99. The upper surface sheet 96 and the bottom surface sheet 97 are combined and fixed to each other by applying known blind rivets to these holes and by caulking so as to assemble the separation member 95 as an integral member.

This separation member 95 has an opening at the front side and an opening at the right side. The separation member 95 is a so-called duct whose left side and back side are closed by the vertical surface 101 of the shielding sheet 98. In the case of the separation member 95, the air intake openings at the front side and the right side has maximum sizes because the shielding sheet 98 is bent at a plurality of positions in a zigzagging manner. For the same reason, air discharge openings formed at the left side and the back side also have maximum sizes.

Figure 12:
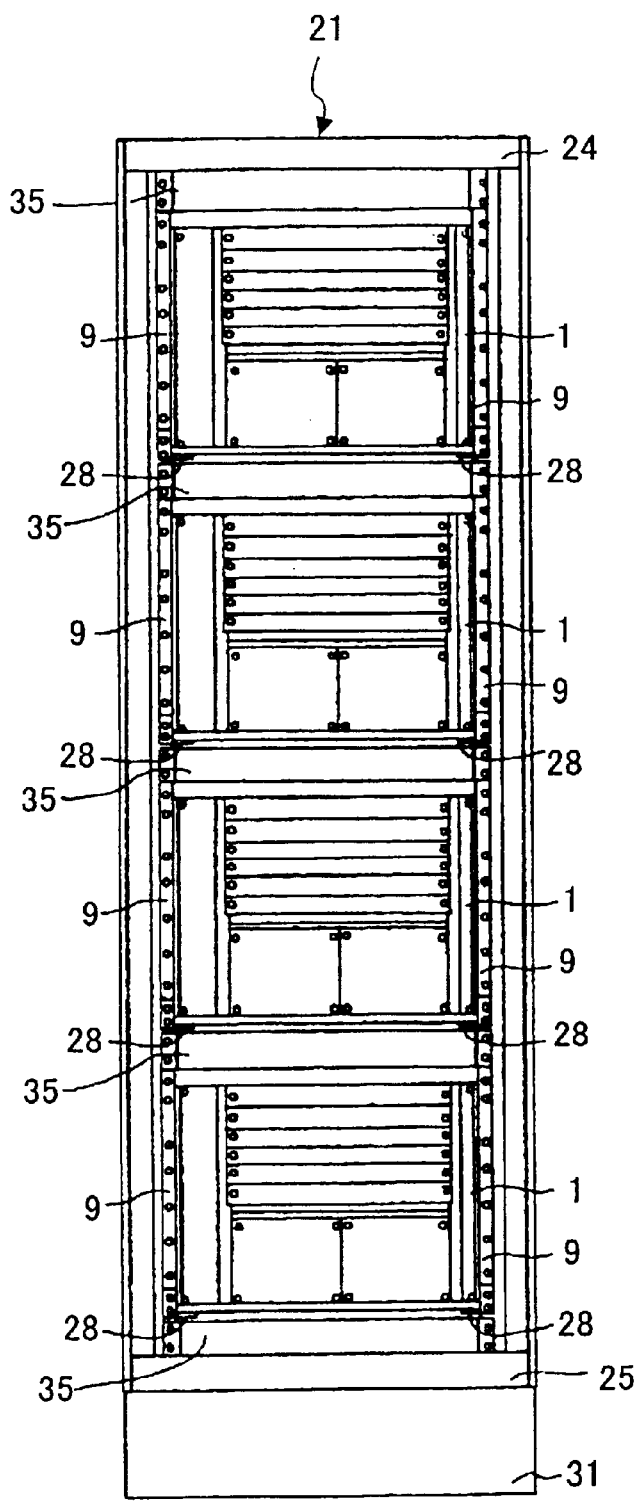
FIG. 12 is a front view of the rack of FIG. 11 to which the communication device subunits are attached.
Figure 13:
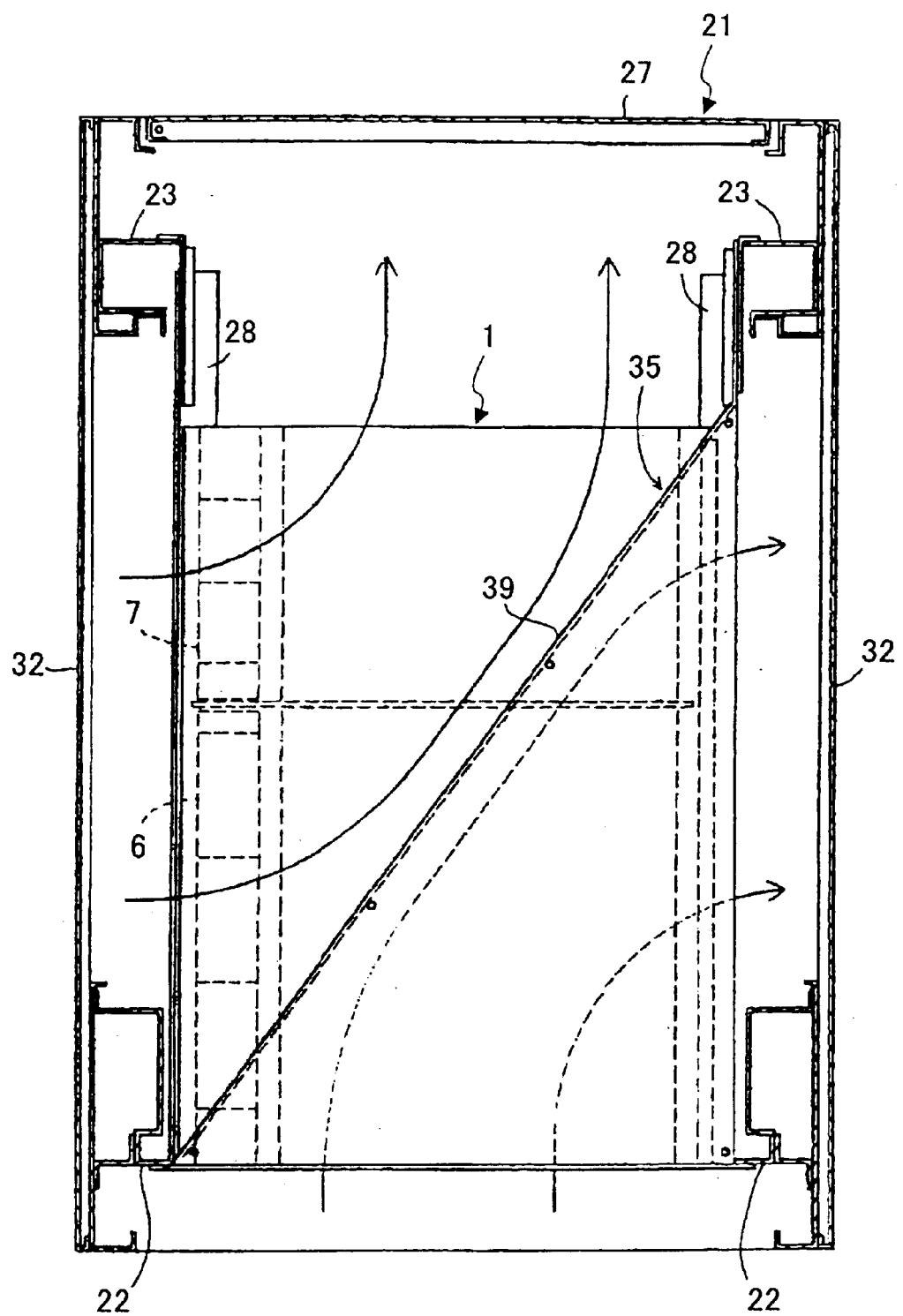
FIG. 13 is a cross sectional view of the rack shown in FIG. 12.

Instead of the separation member 35 of FIGS. 11 to 13, the separation member 95 may be inserted into the rack 21 so that the air intake path and the air discharge path which are securely separated from each other can be configured. Accordingly, it becomes possible to realize an effective cooling configuration for the electronic circuit unit and to thereby arrange a plurality of racks 21 in a row so as to be close to each other. Furthermore, depending on necessity, it is possible to add to the separation member 95 the shielding member 73 of FIG. 16, the shielding members 73 and 77 of FIG. 18, or the shielding members 92 and 93 of FIG. 19, by extending the upper surface sheet 96 or the bottom surface sheet 97 of the separation member 95.

As described above, according to the present invention, it is possible to obtain an excellent cooling structure by applying the only separation members without reorganizing or amending the existing communication device subunit 1 and the rack 21. Therefore, in practical use, large advantages can be obtained, and by adding the shielding members, further larger effects and advantages can be obtained. Of course, it is possible to apply the separation member together with or without shielding member to a single communication device subunit 1. In addition to that, the separation member together with or without the shielding member can be applied to the case where a plurality of communication device subunits 1 are put on top of each other so as to be close to each other, and air intake and discharge paths for a plurality of communication device subunits 1 can be secured together.

The electronic circuit unit is not limited to a printed-circuit board, and the present invention may be applied to a circuit unit which requires a cooling manner in which the circuit unit is cooled by air flow in a horizontal direction. The separation member can be applied to either the upper side or the lower side of the communication device subunit, and can be applied to both of the upper and lower sides of the communication device subunit in order to carry out more effective air intake and discharge. Moreover, the shielding member can also be selectively applied.

In stead of the case where the separation member and the shielding member are made by connecting or combining the metal sheets, the separation member and the shielding member may be made by connecting synthetic resins, or may be integrally made by casting or the like using the synthetic resins. An air flow direction inside the subunit is not limited to the direction from the right side to the left side, and may be the direction from the left side to the right side. In order to apply the separation member and/or the shielding member to this case, the separation member and/or the shielding member can be appropriately adjusted.

In the above-described embodiments, a subject to which the present invention is applied was the communication device subunit, but the present invention may be applied to various information processing devices, other electronic devices, measurement devices, and the like so long as they have a structure similar to the communication device subunit.

According to the cooling structure of the above-described embodiments of the present invention, cooling air which flows into the electronic circuit unit and flows in a horizontal direction can be effectively separated and arranged, so that it is possible to realize a cooling structure in which intake air and discharge air are not mixed with each other. Accordingly, advantages in practical use is outstanding. For example, the subunits can be arranged in a row such that the subunits are close to each other. By using the shielding member, it is possible to obtain more outstanding advantages.

This patent application is based on Japanese Priority Patent Application No. 2002-067514 filed on March 12, 2002, the entire contents of which are hereby incorporated by reference.

What is claimed is:

1. A cooling structure for an electronic circuit unit in which cooling air is forced to pass the electronic circuit unit of a subunit in a horizontal direction, comprising:
   a separation member provided at an upper side and/or a lower side of the subunit for separating intake air and discharge air of the cooling air into a front area and a back area with respect to the subunit,
   wherein the separation member extends from one side to the other side of the subunit, and
   the separation member includes a shielding member which extends toward a side surface of a rack and which shuts off upward and/or downward flow of the cooling air, the rack accommodating the subunit.

2. The cooling structure for the electronic circuit unit according to claim 1,
   wherein the electronic circuit unit is horizontally disposed.

3. The cooling structure for the electronic circuit unit according to claim 1,
   wherein the electronic circuit unit includes a printed-circuit board.

4. The cooling structure for the electronic circuit unit according to claim 1,
   wherein the cooling air is forced to flow and pass the electronic circuit unit by a fan which is provided at a side surface of the electric circuit unit and which is operated by electric power.

5. The cooling structure for the electronic circuit unit according to claim 1, wherein the separation member includes:
   an upper surface sheet;
   a lower surface sheet; and
   a hypotenuse portion which is provided between the upper surface sheet and the lower surface sheet and extends from one side at a front side to the other side at a back side so as to shut off air flow between the front area and the back area.

6. The cooling structure for the electronic circuit unit according to claim 1, wherein the separation member includes:
   an upper surface sheet;
   a lower surface sheet; and
   a shielding sheet which is provided between the upper surface sheet and the lower surface sheet, extends from one side at a front side to the other side at a back side, has at least three bent points so as to separate the intake air and the discharge air into the front area and the back area, and shuts off air flow between the front area and the back area, with the front area being a right area and the back area being a left area.

7. The cooling structure for the electronic circuit unit according to claim 1, wherein the shielding member is formed integrally on an upper surface sheet or a lower surface sheet of the separation member.

8. A cooling structure for an electronic circuit unit in which cooling air is forced to pass the electronic circuit unit of a subunit in a horizontal direction, comprising:
   a separation member provided at an upper side and/or a lower side of the subunit for separating intake air and discharge air of the cooling air into a front area and a back area with respect to the subunit, wherein the separation member extends from one side to the other side of the subunit; and
   a shielding member for shutting off upward and/or downward flow of the cooling air, wherein the shielding member extends toward a side surface of a rack which accommodates the subunit, and the shielding member is disposed on a rail which is provided in the rack and on which the subunit is inserted and which supports the subunit.

9. A cooling structure for an electronic circuit unit in which cooling air is forced to sass the electronic circuit unit of a subunit in a horizontal direction, comprising:
   a separation member provided at an upper side and/or a lower side of the subunit for separating intake air and discharge air of the cooling air into a front area and a back area with respect to the subunit, wherein the separation member extends from one side to the other side of the subunit, and
   wherein the separation member functions as a duct having a first opening located at said front area for taking in the intake air from a front outside and having a second opening through which the intake air flows to the one side of the subunit, such that the intake air passes the electronic unit from the one side to the other side of the subunit,
   and the separation member guides the intake air from the first opening to the second opening, and guides the discharge air discharged from the other side of the subunit to a back side with respect to the subunit so as to be discharged to a back outside.

10. The cooling structure for the electronic circuit unit according to claim 9, further including:

a plurality of separation members including said separation member and each having a substantially same structure as that of said separation member;

a plurality of subunits including said subunit and vertically arranged in a line at predetermined intervals; and a rack for accommodating the plurality of subunits and the plurality of separation members such that the plurality of separation members are respectively provided at respective upper sides of the plurality of subunits, wherein the rack has side covers for preventing the intake air and the discharge air inside the rack from interfering with outside air at both sides of the rack.

11. The cooling structure for the electronic circuit unit according to claim 10, including:

a plurality of racks including said rack and each having a substantially same structure as that of said rack and arranged in a row such that sides of the plurality of racks are close to each other.

12. The cooling structure for the electronic circuit unit according to claim 9, wherein the separation member includes:

a cover part; and a body part coupled to the cover part so as to create a duct structure for improved air flow.

13. The cooling structure for the electronic circuit unit according to claim 12, wherein the separation member is provided at the upper side of the subunit, and the body part has a shape of a right triangle, the cover part is approximately rectangular shaped, and a shielding member is provided at one side of the cover part for preventing the intake air flowing from the second opening from flowing to an upper side of the shielding member, and another shielding member is provided at the other side of the cover part for preventing the discharge air discharged from the other side of the subunit from flowing to an upper side of the another shielding member.

14. The cooling structure for the electronic circuit unit according to claim 12 wherein the body part and the cover part are each approximately L-shaped.

15. The cooling structure for the electronic circuit unit according to claim 12, wherein the body part has a shape of a right triangle, and the separation member includes a hypotenuse portion with respect to the right triangle, and the hypotenuse portion extends from one side at a from side to the other side at a back side, and separates the front area from the back area in an oblique direction so as to separate the intake air from the discharge air.

16. The cooling structure for the electronic circuit unit according to claim 15, wherein one side surface of the hypotenuse portion guides the intake air from the first opening to the second opening, and the other side surface of the hypotenuse portion guides the discharge air discharges from the other side of the subunit to a back side with respect to the subunit so as to be discharged to the back outside.

17. The cooling structure for the electronic circuit unit according to claim 12, wherein the separation member is provided at the upper side of the subunit, and the cover part includes a shielding member located above the second opening for preventing the intake air flowing from the second opening from flowing to an upper side of the shielding member.

18. The cooling structure for the electronic circuit unit according to claim 17, further including:

a plurality of separation members including said separation member and each having a substantially same structure as that of said separation member;

a plurality of subunits including said subunit and vertically arranged in a line at predetermined intervals; and a rack for accommodating the plurality of subunits and the plurality of separation members such that the plurality of separation members are respectively provided at respective upper sides of the plurality subunits, wherein the rack has side covers for preventing the intake air and the discharge air inside the rack from interfering with outside air at both sides of the rack.

19. The cooling structure for the electronic circuit unit according to claim 18, further including:

a plurality of shielding members each of which prevents the discharge air each discharged from the other sides of the plurality of subunits from flowing to respective upper sides of the plurality of shielding members.

20. The cooling structure for the electronic circuit unit according to claim 19, including:

a plurality of racks including said rack and each having a substantially same structure as that of said rack and arranged in a row such that sides of the plurality of racks are close to each other.

21. a cooling structure for the electronic circuit unit in a horizontal air flow path, comprising:

a separation member attached to at least one of upper and lower sides of the subunit and extending from one side of the subunit to the other side of the subunit, thereby creating two exclusive air flow areas, wherein the separation member is positioned to separate air flow into first air flow area extending from a front side at said at least one of upper and lower sides of the subunit to the one side of the subunit and a second air flow area extending from the other side of the subunit to a back side, so that cooling air can enter the first air flow area from said front side, be introduced to an inside of the subunit, flow from one side to the other side of the subunit, in the horizontal air flow path, enter the second air flow area form the other side of the subunit, and flow to said back side to be discharged.

* * * * *